US009913405B2

(12) United States Patent
Gambino et al.

(10) Patent No.: US 9,913,405 B2
(45) Date of Patent: Mar. 6, 2018

(54) GLASS INTERPOSER WITH EMBEDDED THERMOELECTRIC DEVICES

(71) Applicant: International Business Machines Corporation, Armonk, NY (US)

(72) Inventors: Jeffrey P. Gambino, Portland, OR (US); Richard S. Graf, Gray, ME (US); Sudeep Mandal, Bangalore (IN); David J. Russell, Owego, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/668,017

(22) Filed: Mar. 25, 2015

(65) Prior Publication Data

US 2016/0286686 A1     Sep. 29, 2016

(51) Int. Cl.
| | |
|---|---|
| *H01L 21/00* | (2006.01) |
| *H05K 7/20* | (2006.01) |
| *H01L 35/34* | (2006.01) |
| *H01L 23/15* | (2006.01) |
| *H01L 23/38* | (2006.01) |
| *H05K 1/03* | (2006.01) |
| *H01L 23/13* | (2006.01) |
| *H01L 23/00* | (2006.01) |

(52) U.S. Cl.
CPC ........... *H05K 7/2039* (2013.01); *H01L 23/15* (2013.01); *H01L 23/38* (2013.01); *H01L 35/34* (2013.01); *H01L 23/13* (2013.01); *H01L 24/13* (2013.01); *H01L 24/16* (2013.01); *H01L 2224/13099* (2013.01); *H01L 2224/16225* (2013.01); *H01L 2924/14* (2013.01); *H01L 2924/15788* (2013.01); *H01L 2924/181* (2013.01); *H05K 1/0306* (2013.01); *H05K 2201/10219* (2013.01); *H05K 2201/10378* (2013.01)

(58) Field of Classification Search
CPC ................................. H01L 35/24; H01L 35/34
USPC ........................................................ 438/122
See application file for complete search history.

(56) References Cited

U.S. PATENT DOCUMENTS

| | | |
|---|---|---|
| 5,032,897 A | 7/1991 | Mansuria et al. |
| 7,224,059 B2 | 5/2007 | Shimada et al. |
| 7,523,617 B2 | 4/2009 | Venkatasubramanian et al. |
| 7,833,816 B2 | 11/2010 | Baskaran |
| 7,851,905 B2 | 12/2010 | Chrysler et al. |
| 7,855,397 B2 | 12/2010 | Alley et al. |

(Continued)

OTHER PUBLICATIONS

Kouma et al., "A high-output-voltage micro-thermoelectric generator having high-aspect-ratio structure", Journal of Micromechanics and Microengineering, 23(11), pp. 114005-1 to 114005-8 (2013).

(Continued)

*Primary Examiner* — Hsin-Yi Hsieh
(74) *Attorney, Agent, or Firm* — Scully Scott Murphy and Presser; Steven Fischman

(57) ABSTRACT

The present invention relates generally to integrated circuit (IC) chip packaging, and more particularly, to a structure and method of forming a glass interposer having one or more embedded peltier devices, alongside electrically conductive vias, to help dissipate heat from one or more IC chips in a multi-dimensional chip package through the glass interposer and into an organic carrier, where it can be dissipated into an underlying substrate.

8 Claims, 23 Drawing Sheets

(56) References Cited

U.S. PATENT DOCUMENTS

| | | | |
|---|---|---|---|
| 8,030,113 | B2 | 10/2011 | Hsu et al. |
| 8,319,331 | B2 | 11/2012 | Ibaraki |
| 9,368,429 | B2 | 6/2016 | Ma et al. |
| 2007/0188082 | A1 | 8/2007 | Kato et al. |
| 2009/0321909 | A1 | 12/2009 | Gu et al. |
| 2013/0228918 | A1 | 9/2013 | Chen et al. |
| 2014/0318588 | A1* | 10/2014 | Kouma .................. H01L 35/34 136/200 |

OTHER PUBLICATIONS

Yoo et al., "Electrochemically deposited thermoelectric n-type Bi2Te3 thin films", Electrochimica Acta 50 pp. 4371-4377 (2005).

Li et al., "Fabrication of Nanostructured Thermoelectric Bismuth Telluride Thick Films by Electrochemical Deposition", Chem. Mater. 18, pp. 3627-3633 (2006).

Snyder et al., "Hot Spot Cooling Using Embedded Thermoelectric Coolers", Twenty-Second Annual IEEE Semiconductor Thermal Measurement and Management Symposium, pp. 135-143 (2006).

Redmond et al., "Thermoelectric cooler for hot spot thermal management of 3D stacked chips", Proc. of the ASME 2011 International Mechanical Engineering Congress and Exposition (IMECE2011), pp. 775-784 (2011).

Redmond et al., "Optimization of Thermoelectric Coolers for Hotspot Cooling in 3D Stacked Chips", Journal of Electronic Packaging. (30 pages) Received Feb. 6, 2014; Accepted manuscript posted Aug. 13, 2014. doi:10.1115/1.4028254.

Lim et al., "Thermoelectric Microdevice Fabrication Process and Evaluation at the Jet Propulsion Laboratory (JPL)", Proc. IEEE 21st International Conf. on Thermoelectronics, pp. 535-539 (2002).

Anonymous, "The Thermal Copper PillarBump", Technical Bulletin from Nextreme Thermal Solutions, Jan. 9, 2008, from www.nextreme.com.

Fleurial et al., "Thick-Film Thermoelectric Microdevices", 2000 IEEE, 18th International Conference on Thermoelectrics (1999), pp. 294-300.

Pending U.S. Appl. No. 14/067,507, filed Oct. 30, 2013, entitled "Thermal Energy Dissipation Using Backside Thermoelectric Devices".

Snyer et al., "Complex Thermoelectric Materials", Nature Materials 7, 105-114, 2008, http://www.nature.com/nmat/journal/v7/n2/abs/nmat2090.html, accessed Mar. 25, 2015.

Pending U.S. Appl. No. 14/668,031, filed Mar. 25, 2015, entitled: "Glass Interposer With Thermal Vias".

Office Action dated Oct. 23, 2017 issued in corresponding Taiwanese Patent Appln. No. 105103477, filed Feb. 3, 2016.

\* cited by examiner

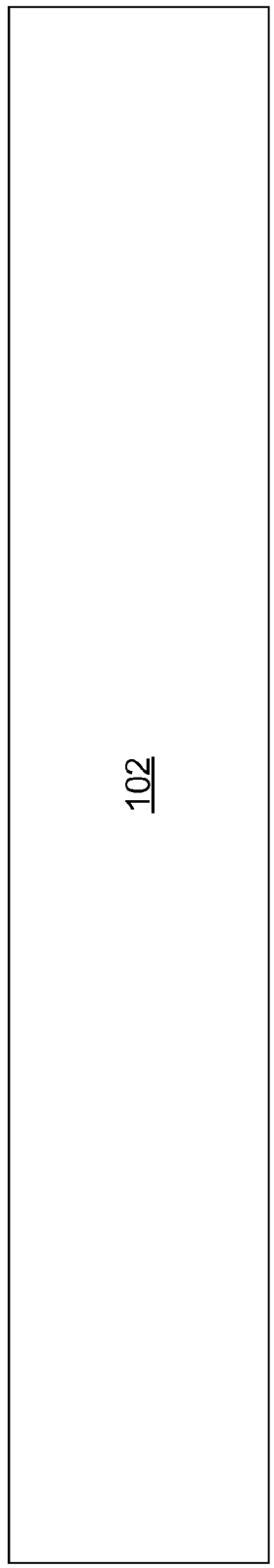
FIG. 1

GLASS INTERPOSER WITH EMBEDDED THERMOELECTRIC DEVICES

BACKGROUND

The present invention relates generally to integrated circuit (IC) chip packaging, and more particularly, to a structure and method of forming a glass interposer having one or more embedded peltier devices to help dissipate heat in multi-dimensional chip packages.

Multi-layer electronic components are typically joined together by soldering pads on a surface of one of the electronic components to corresponding pads on the surface of the other component. Broadly stated, one or more integrated circuit (IC) chips (i.e., dies) are typically connected to an organic carrier through an interposer. The organic carrier may be electrically connected to a single or multi-layer substrate, such as a printed circuit board (PCB). Pads on the IC chips may be electrically and mechanically connected to corresponding pads on the interposer by a plurality of plurality of small-pitch electrical connections (i.e., micro-solder connections). The interposer may then be electrically and mechanically connected to the organic carrier by larger pitch solder connections.

Therefore, the pitch of the solder connections on the top side of the glass interposer (joined to the IC chip) is typically smaller than the pitch of the solder connections on the bottom side of the glass interposer (joined to the organic carrier). Multi-dimensional packages with interposers that use through silicon vias (TSVs) as an electrical pathway from the IC chips to the organic carrier are typically regarded as 2.5D packages.

SUMMARY

According to an embodiment, a method is disclosed. The method may include: forming vias in a glass interposer; forming an embedded peltier device in two adjacent vias; and depositing an electrically conductive material in an additional via, on the embedded peltier device, and on the glass interposer.

According to another embodiment, a method of dissipating heat from one or more integrated circuit (IC) chips in a 2.5 dimensional package into an underlying substrate is disclosed. The method may include: joining an organic carrier to the underlying substrate using solder connections; joining a glass interposer to the organic carrier using solder connections, the glass interposer comprising a mixture of embedded peltier devices and electrically conductive vias, wherein the embedded peltier devices provide a pathway for heat transfer; and joining the one or more IC chips to the glass interposer using micro-solder connections.

According to another embodiment, a structure is disclosed. The structure may include: a glass interposer; an embedded peltier device extending through an entire thickness of the glass interposer; an electrically conductive via extending through the entire thickness of the glass interposer, the one or more electrically conductive vias comprising a conductive metal; and one or more insulators on the glass interposer, the one or more insulators extending through the conductive metal.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIG. 1 is a cross section view of a structure including an interposer, according an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 2:
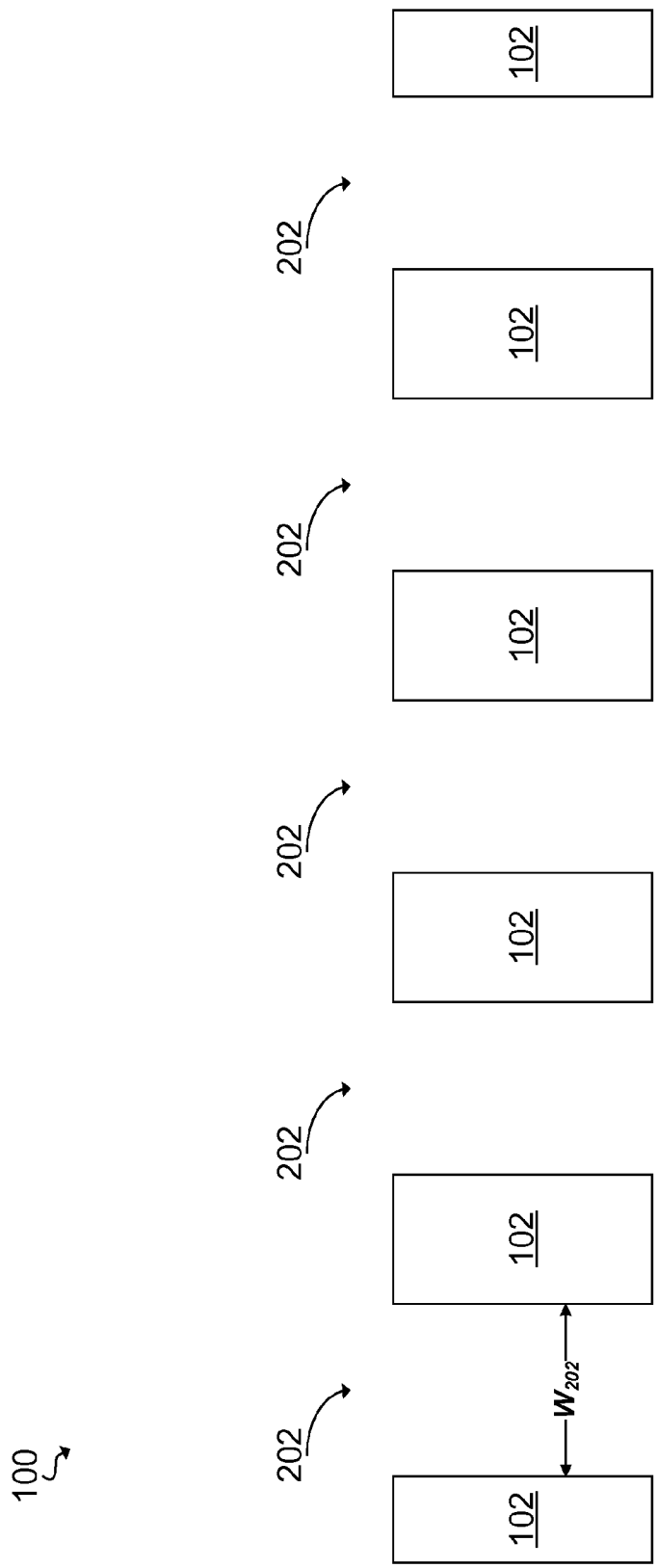
FIG. 2 is a cross section view illustrating forming vias through the interposer, according an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to integrated circuit (IC) chip packaging, and more particularly, to a structure and method of forming a glass interposer having one or more embedded peltier devices to help dissipate heat in multi-dimensional chip packages. Interposers have typically been fabricated from silicon, but as 2.5D technologies expand, glass interposers are emerging as a competitive high performance low-cost option used for their superior electrical insulation.

However, because of their poor thermal conductivity, glass interposers may face thermal challenges for applications that do not have an exposed die and heat sink. For example, mobile applications that use a chip-interposer-substrate package are typically sealed off by a protective mold compound (i.e., overmolded). These chip-interposer-substrate packages use the underlying PCB for cooling, but because of the poor thermal conductivity of glass interposers, the heat cannot travel into the PCB efficiently. This may lead to overheating and other performance problems.

Embodiments of the present invention may use one or more peltier devices formed in the glass interposer to improve heat transfer from active devices in chip into the organic carrier and PCB. Peltier devices utilize the peltier effect (i.e., heat exchange occurs at a junction between two materials, such as a conductive metal and $Bi_2Te_3$ with the flow of electrical current) to move heat from one side of a device ("cold side") to another side ("hot side"). The peltier devices may be composed of a n-type via extending through the interposer adjacent to a p-type via extending through the interposer. The n-type via and the p-type via may electrically connected, and the flow of current through them may drive the transfer of heat. This occurs because as the electron energy changes going from one material to the other, energy in the form of heat is transferred to the surrounding lattice. Methods of improving heat transfer and reducing junction temperature for overmolded applications using a glass interposer with embedded peltier devices are described below in detail with reference to FIGS. 1-22B. An embodiment by which the peltier devices are formed by etching through an interposer is described below with reference to FIGS. 1-9. An embodiment by which the peltier devices are formed in an interposer by backside exposure is described below with reference to FIGS. 10-20.

Referring now to FIG. 1, a cross section view of a structure 100, which may illustrate a preliminary step in the following process, is shown. The structure 100 may include a portion of an interposer 102, preferably composed of glass. The interposer 102 may be a conventional glass interposer and may be composed of a conventional material typically used for glass interposers, such as, for example $SiO_2$ doped with various oxides. In an embodiment, the interposer 102 may have a composition that results in a coefficient of thermal expansion (CTE) that closely matches silicon. The interposer 102 may be made by a glass manufacturing system that uses a fusion process to fabricate glass sheets which can be cut into the desired shape of the interposer 102. The interposer 102 may have any desired shape, such as, for example, a 300 mm diameter circle, or a square/rectangular panel with dimensions of approximately 500×500 mm, although larger or smaller panels are considered. Alternatively, the interposer 102 can be manufactured by any glass manufacturing system and then polished or etched to a desired uniform thickness. In an embodiment, the glass interposer 102 may have a thickness ranging from approximately 50 μm to approximately 700 μm.

Referring now to FIG. 2, a cross section view illustrating forming one or more vias 202 (hereinafter "vias") in the interposer 102 is shown. The vias 202 may extend through an entire thickness of the interposer 102. In an embodiment, the vias 202 may be formed using a conventional etching process, such as, for example, electrostream drilling (ESD) etching, reactive ion etching (RIE), or photolithography in embodiments in which a photosensitive glass interposer is used. In another embodiment, the vias 202 may be formed using a laser etching process. The vias 202 may have a width $W_{202}$ ranging from approximately 10 μm to approximately 300 μm, with wider widths being preferred to allow for better thermal transfer.

Figure 3:
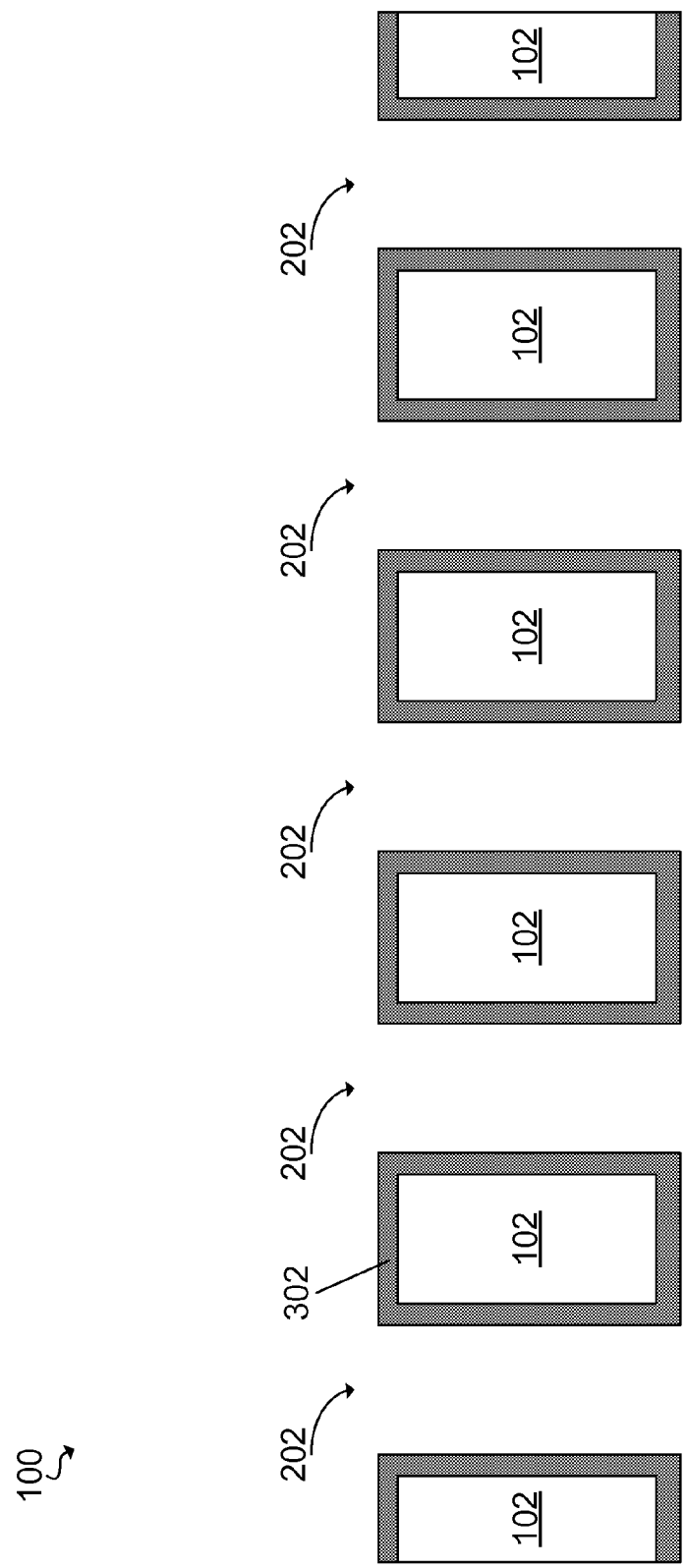
FIG. 3 is a cross section view illustrating depositing a seed layer on the interposer and in the vias, according an embodiment of the present invention.

Referring now to FIG. 3, a cross section view illustrating forming a seed layer 302 on the interposer 102 and in the vias 202 is shown. The seed layer 302 may be composed of an electrically conductive material such as, for example, titanium, copper, cobalt, ruthenium, chromium, gold, platinum, or alloys thereof. The seed layer 302 may be deposited conformally on the interposer 102 using a conventional deposition process, such as, for example, atomic layer deposition (ALD), chemical vapor deposition (CVD), plasma enhanced vapor deposition (PECVD), physical vapor deposition (PVD), molecular beam deposition (MBD), pulsed laser deposition (PLD), liquid source misted chemical deposition (LSMCD), plating, or sputtering.

Figure 4:
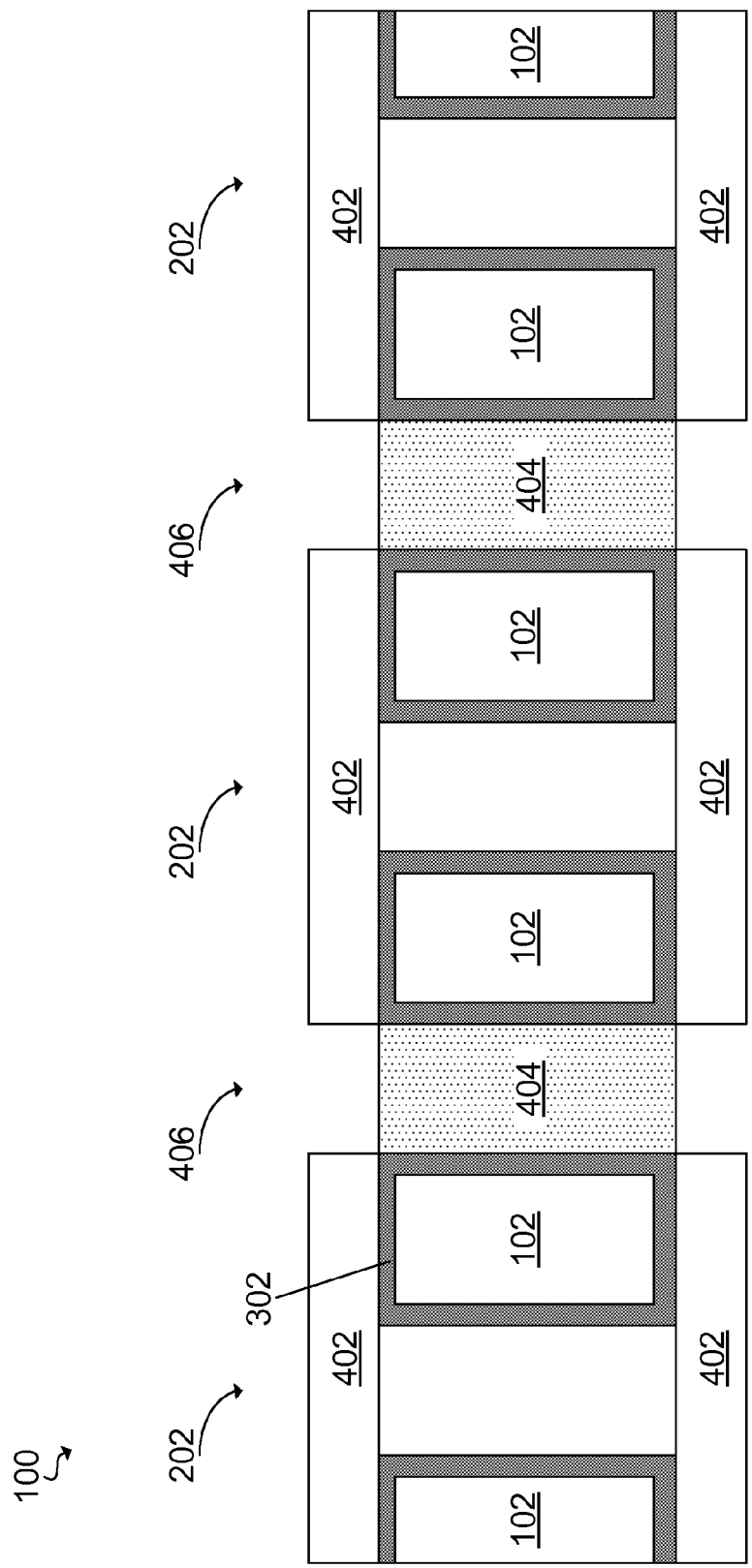
FIG. 4 is a cross section view illustrating forming an etch stop layer on portions of the interposer and over a number of the vias and depositing a n-type material in the exposed vias, according an embodiment of the present invention.

Referring now to FIG. 4, a cross section view illustrating forming a first etch stop layer 402 on portions of the interposer 102 and over a number of the vias 202 is shown. The first etch stop layer 402 may be composed of an oxide or a nitride and may be formed using a conventional deposition process, such as, for example, ALD, CVD, PECVD, PVD, MBD, PLD, LSMCD, or sputtering.

In an embodiment, one or more openings 406 (hereinafter "openings") may be formed in the first etch stop layer 402 using a conventional patterning and etching process. The openings 406 may expose one or more of the vias 202. The exposed vias 202 may be filled with a n-type material 404. In an embodiment, the n-type material 404 may be composed of a semiconductor material, such as bismuth telluride, that has been doped with n-type dopants, such as arsenic or phosphorous, using a conventional doping process. After the n-type material 404 is deposited, the first etch stop layer 402 may be removed. In an embodiment, the first etch stop layer 402 may be removed selective to the interposer 102, the seed layer 302 and the n-type material 404 using a conventional etching process. In another embodiment, the first etch stop layer 402 may be removed using a conventional planarization technique, such as, for example, chemical mechanical planarization (CMP).

Figure 5:
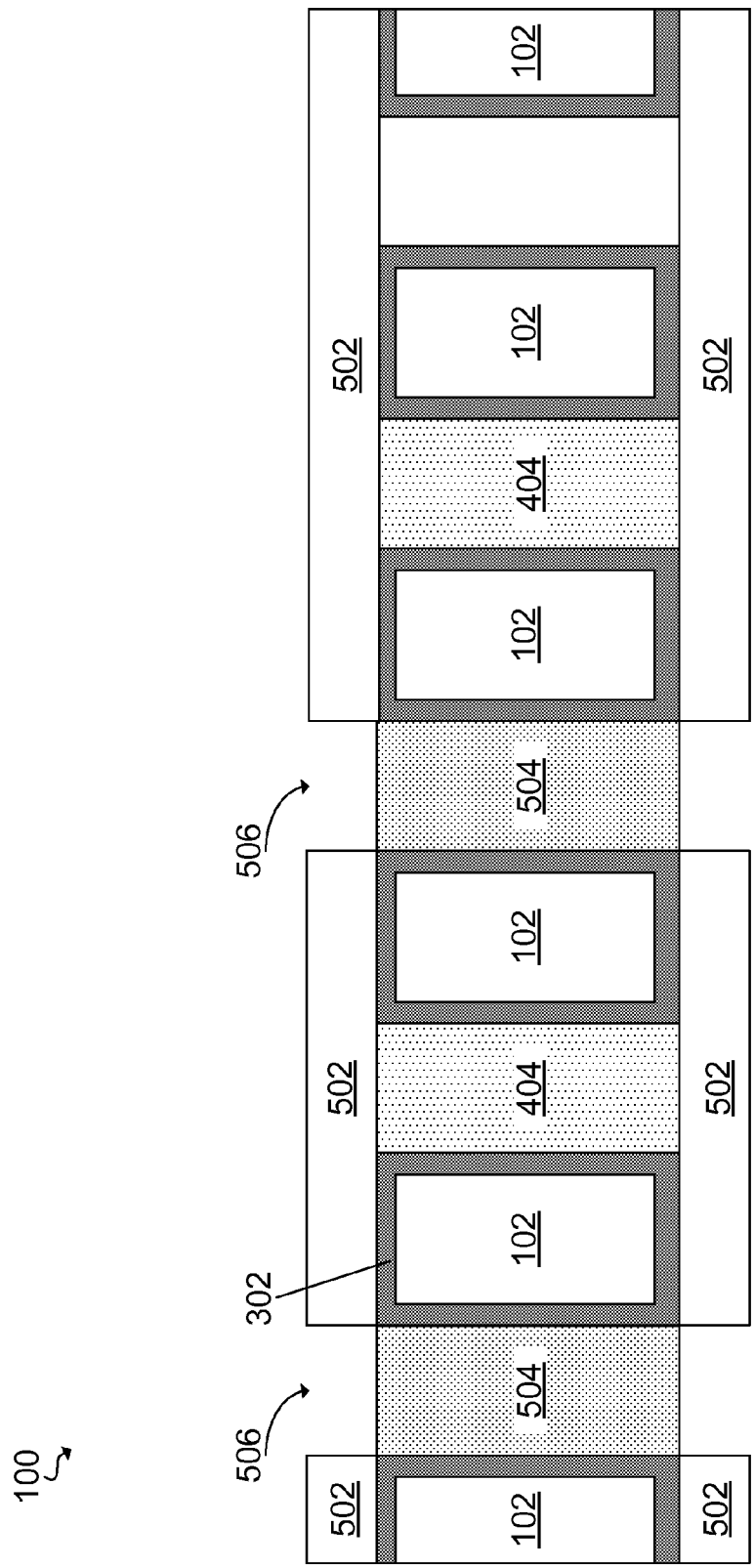
FIG. 5 is a cross section view illustrating forming an etch stop layer on portions of the interposer and over the n-type material and depositing a p-type material in the exposed vias, according an embodiment of the present invention.

Referring now to FIG. 5, a cross section view illustrating forming a second etch stop layer 502 on portions of the interposer 102, the n-type material 404, and over a number of the vias 202 is shown. The second etch stop layer 502 may be composed of an oxide or a nitride and may be formed using a conventional deposition process, such as, for example, ALD, CVD, PECVD, PVD, MBD, PLD, LSMCD, or sputtering.

In an embodiment, one or more openings 506 (hereinafter "openings") may be formed in the second etch stop layer 502 using a conventional patterning and etching process. The openings 506 may expose one or more of the vias 202. The exposed vias 202 may be filled with a p-type material 504. In an embodiment, the p-type material 504 may be composed of a semiconductor material, such as bismuth telluride, that has been doped with p-type dopants, such as boron or aluminum, using a conventional doping process.

After the p-type material 504 is deposited, the second etch stop layer 502 may be removed. In an embodiment, the second etch stop layer 502 may be removed selective to the interposer 102, the seed layer 302, the n-type material 404, and the p-type material 504, using a conventional etching process. In another embodiment, the second etch stop layer 502 may be removed using a conventional planarization technique, such as, for example, chemical mechanical planarization (CMP).

Figure 6:
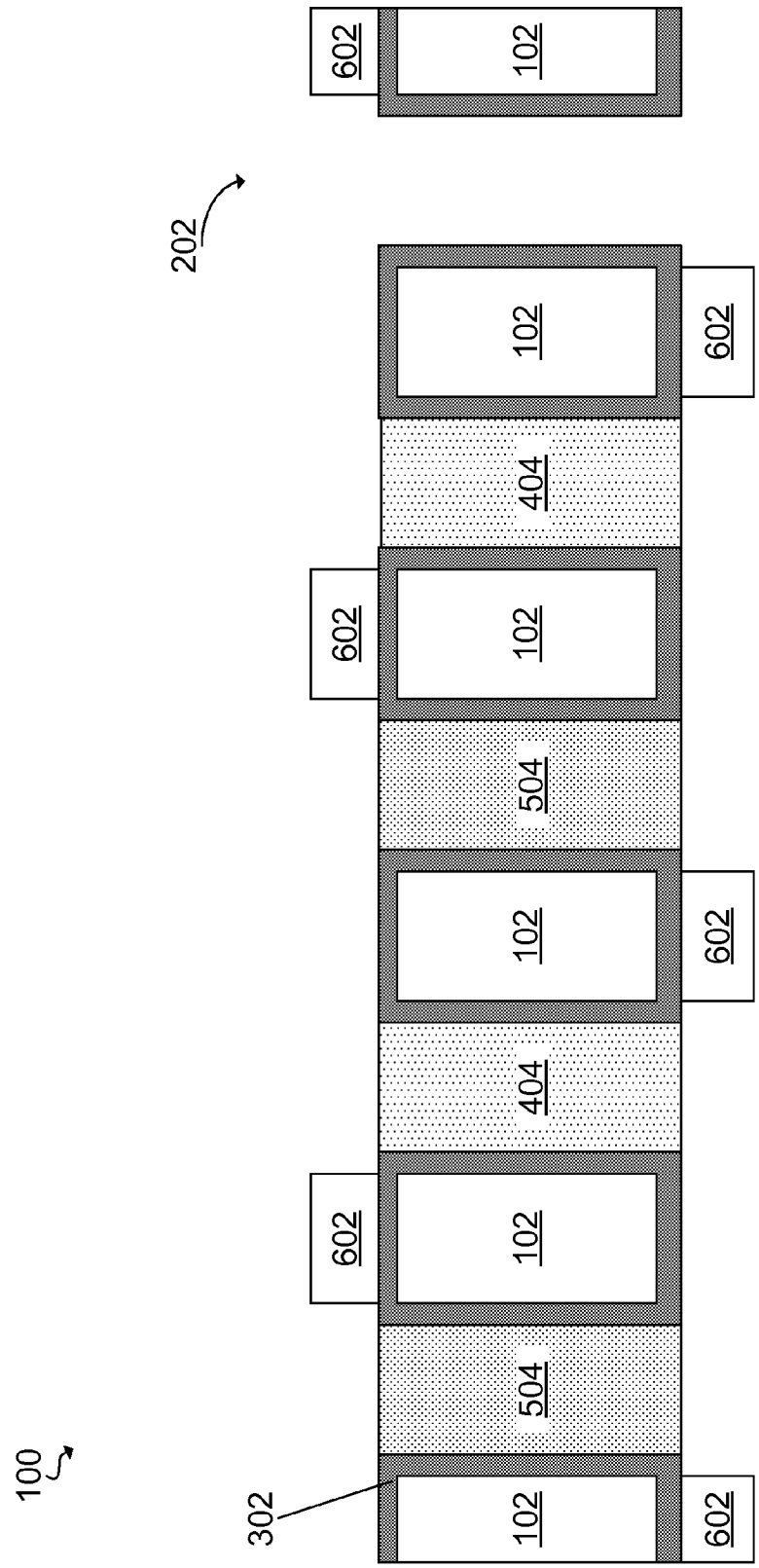
FIG. 6 is a cross section view illustrating forming a patterning layer on the seed layer, according an embodiment of the present invention.

Referring now to FIG. 6, a cross section view illustrating forming a patterning layer 602 on the seed layer 302 is shown. In an embodiment, the patterning layer 602 may be composed of a conventional resist material that has been patterned by, for example, a conventional photolithography process. The resist may be a conventional positive tone or negative tone resist. In another embodiment, the patterning layer 602 may be composed of a hardmask material, an oxide, or a nitride.

Figure 7:
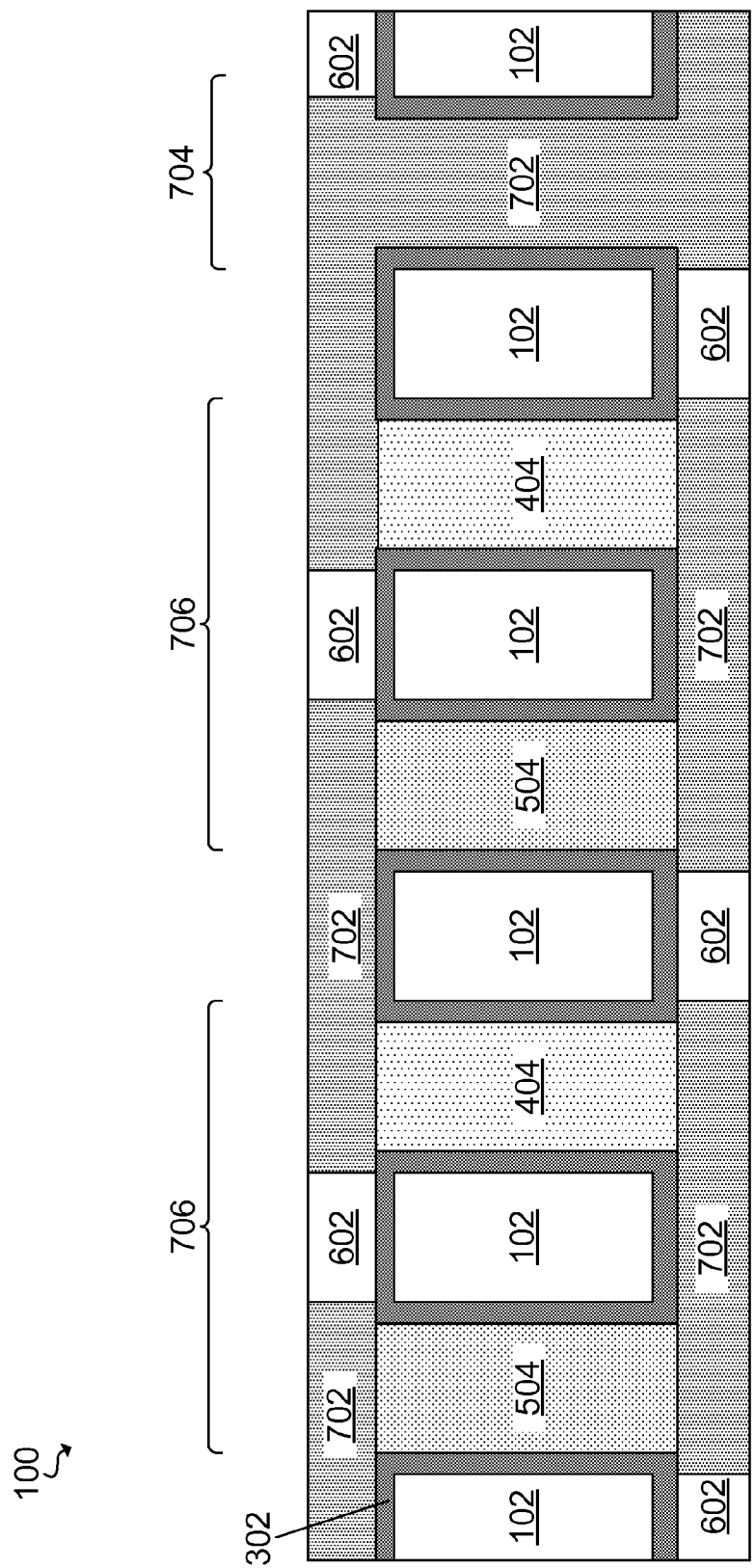
FIG. 7 is a cross section view illustrating depositing an electrically conductive material on the seed layer and in the vias to form one or more electrically conductive vias, according an embodiment of the present invention.

Referring now to FIG. 7, a cross section view illustrating depositing an electrically conductive material 702 on the seed layer 302 and in the vias 202 (FIG. 7) to form one or more electrically conductive vias 704 is shown. In an embodiment, the electrically conductive material 702 may be composed of a metal, such as, for example, copper, aluminum, titanium, platinum, or alloys thereof. The electrically conductive material 702 may be deposited using a conventional deposition process, such as, for example, ALD, CVD, PECVD, PVD, MBD, PLD, LSMCD, plating, or sputtering. The conductive material 702 may be in direct contact with an upper surface and a lower surface of the n-type material 404 and an upper surface and a lower surface of the p-type material 504, forming one or more peltier devices 706 (hereinafter "peltier devices"). After the electrically conductive material 702 is deposited, it may be planarized using a conventional planarization techniques, such as CMP, such that an upper surface of the electrically conductive material 702 is substantially flush with an upper surface of the patterning layer 602.

Figure 8:
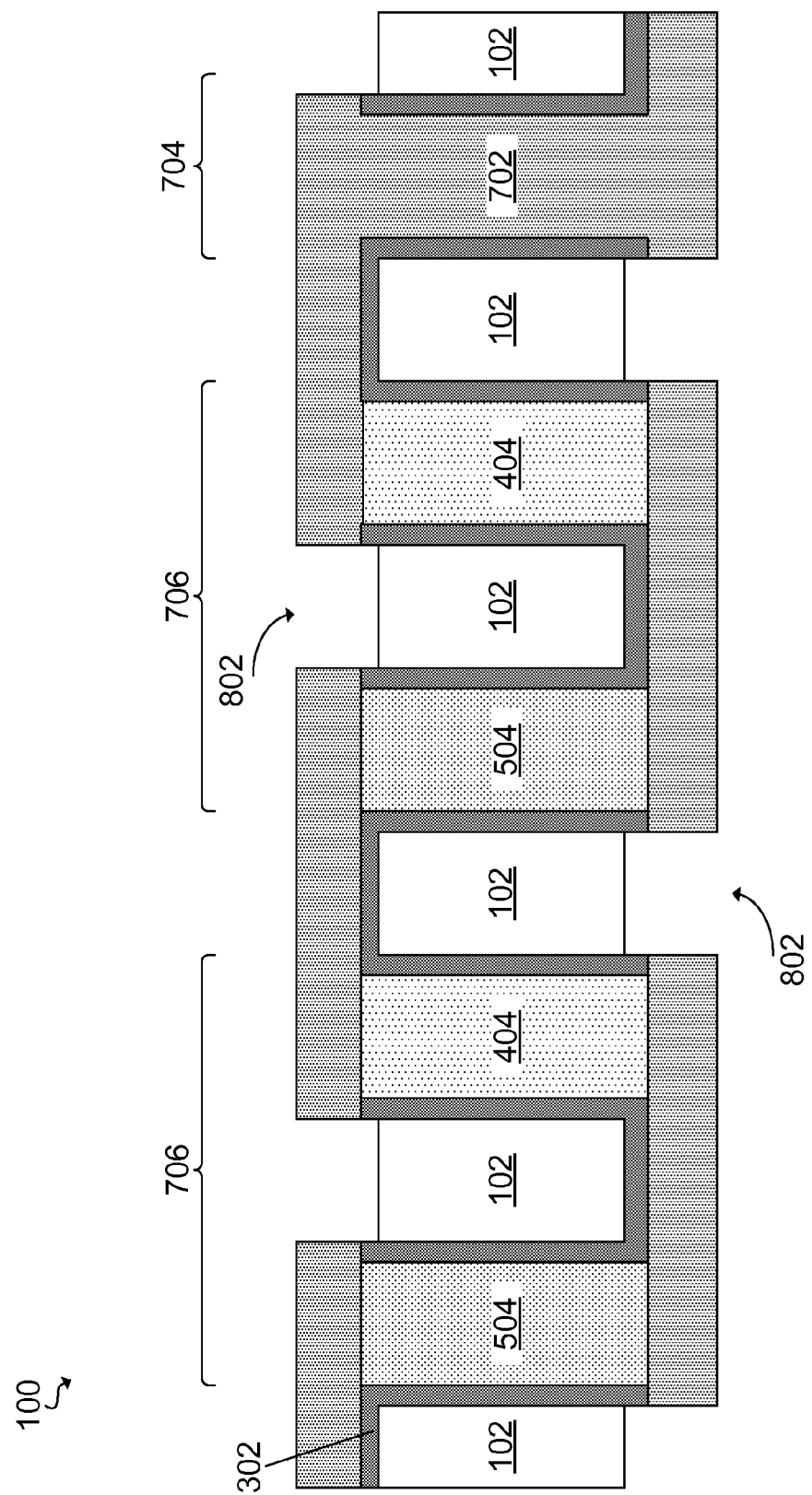
FIG. 8 is a cross section view illustrating removing the patterning layer and underlying portions of the seed layer to form one or more openings, according an embodiment of the present invention.

Referring now to FIG. 8, a cross section view illustrating removing the patterning layer 602 (FIG. 7) and underlying portions of the seed layer 302 to form one or more openings 802 (hereinafter "openings") is shown. In an embodiment, the patterning layer 602 and underlying portions of the seed layer 302 may be removed, selective to the electrically conductive material 702, using a conventional etching process, such as RIE, wet etching, or stripping. The openings 802 may expose the upper surface and the lower surface of the interposer 102 and may separate portions of the electrically conductive material 702 from one another.

Figure 9:
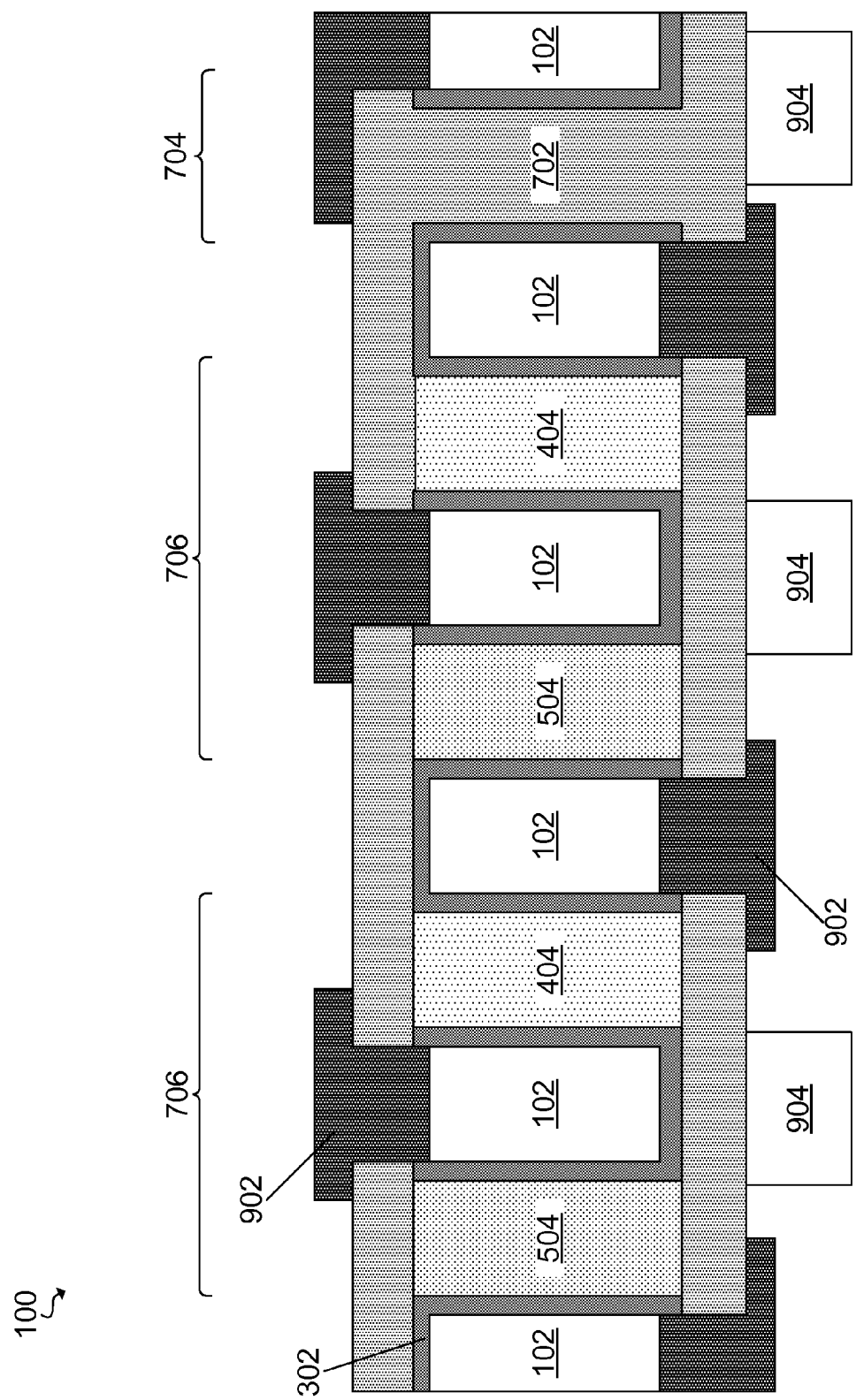
FIG. 9 is a cross section view illustrating forming an insulator on the electrically conductive material and in the openings, according an embodiment of the present invention.

Referring now to FIG. 9, a cross section view illustrating forming an insulator 902 on the electrically conductive material 702 and in the openings 802 (FIG. 8) is shown. In an embodiment, the insulator 902 may be composed of an electrically insulating material, such as, for example, a polyimide or a low-k dielectric. The insulator 902 may be deposited using a conventional deposition technique, such as, for example, ALD, CVD, PECVD, PVD, MBD, PLD, LSMCD, plating, or sputtering. The insulator 902 may be patterned so as to leave portions of the electrically conductive material 702 exposed. In an embodiment, one or more solder connections 904 (hereinafter "solder connections") may be formed on the bottom of the interposer 102 on exposed portions of the electrically conductive material 702. The solder connections 904 may be formed using conventional techniques, and may be composed of one or more layers of conductive material.

In another embodiment, as described below with reference to FIGS. 10-20, the embedded peltier devices may be formed in an interposer using a backside exposure technique.

Figure 10:
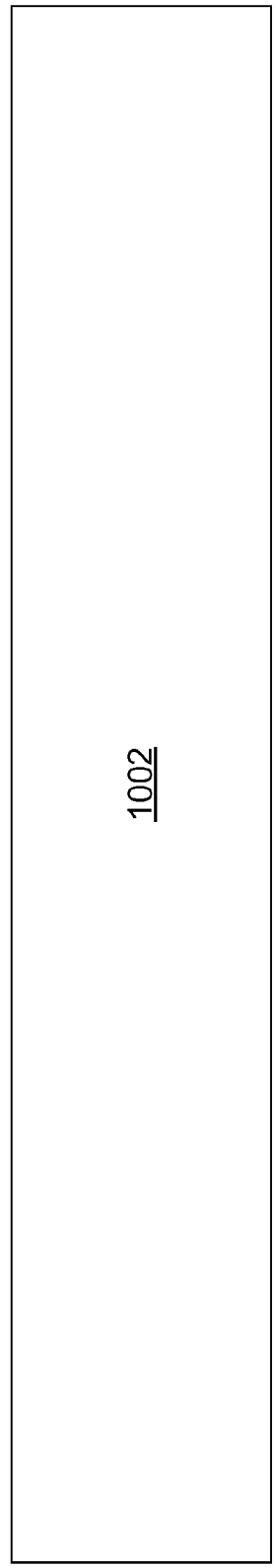
FIG. 10 is a cross section view of a structure including an interposer, according an embodiment of the present invention.

Referring now to FIG. 10, a cross section view of a structure 200, which may illustrate a preliminary step in the following process, is shown. The structure 200 may include a portion of an interposer 1002, preferably composed of glass. The interposer 1002 may be a conventional glass interposer and may be composed of a conventional material typically used for glass interposers, such as, for example $SiO_2$ doped with various oxides. In an embodiment, the interposer 1002 may have a composition that results in a coefficient of thermal expansion (CTE) that closely matches silicon. The interposer 1002 may be made by a glass manufacturing system that uses a fusion process to fabricate glass sheets which can be cut into the desired shape of the interposer 1002. The interposer 1002 may have any desired shape, such as, for example, a 300 mm diameter circle, or a square/rectangular panel with dimensions of approximately 500×500 mm, although larger or smaller panels are considered. Alternatively, the interposer 1002 can be manufactured by any glass manufacturing system and then polished or etched to a desired uniform thickness. In an embodiment, the glass interposer 1002 may have a thickness ranging from approximately 50 μm to approximately 700 μm.

Figure 11:
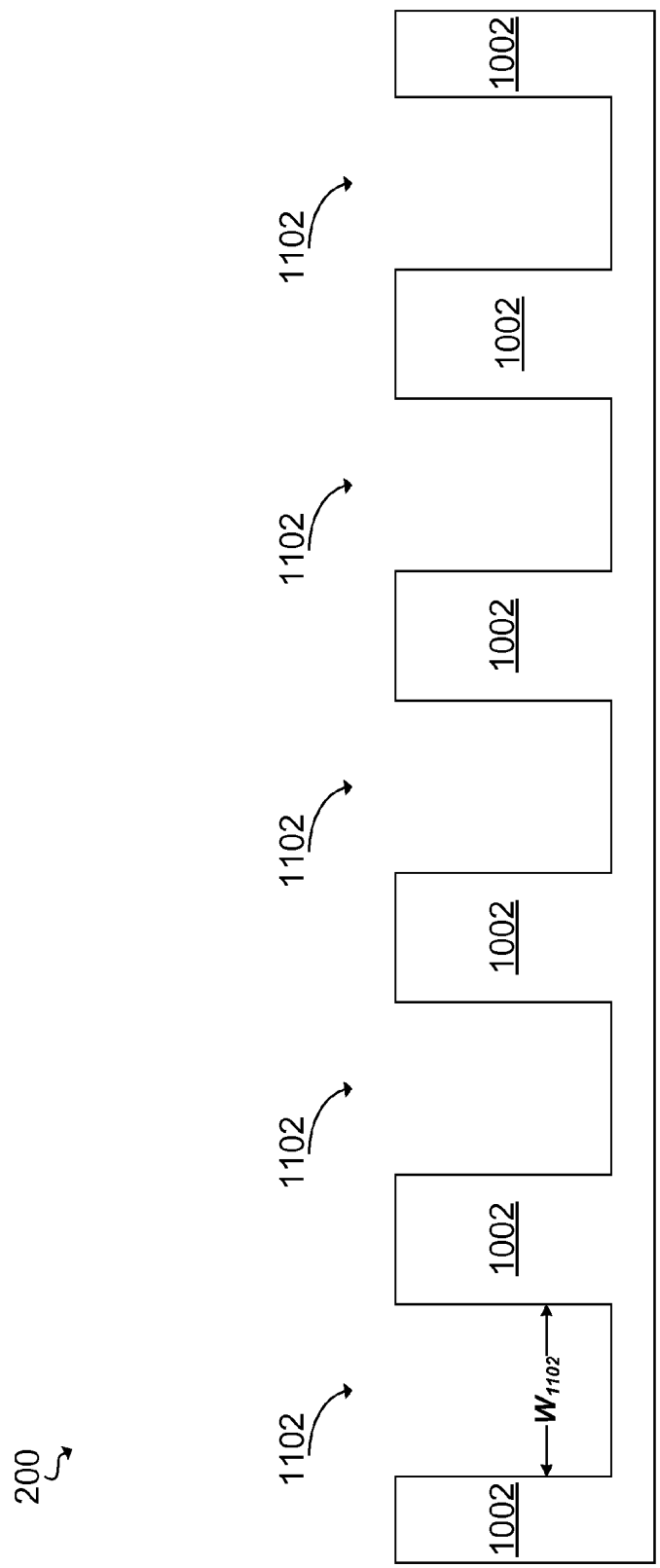
FIG. 11 is a cross section view illustrating forming vias in the interposer, according an embodiment of the present invention.

Referring now to FIG. 11, a cross section view illustrating forming one or more vias 1102 (hereinafter "vias") in the interposer 1002 is shown. The vias 1102 may extend from an upper surface of the interposer 1002 and may have a height less than the thickness of the interposer 1002. The vias 1102 may have a bottom that is separated from a bottom surface of the interposer 1002 by a lower portion of the interposer 1002. In an embodiment, the vias 1102 may be formed using a conventional etching process, such as, for example, electrostream drilling (ESD) etching, reactive ion etching (RIE), or photolithography in embodiments in which a photosensitive glass interposer is used. In another embodiment, the vias 1102 may be formed using a laser etching process. The vias 1102 may have a width $W_{1102}$ ranging from approximately 10 μm to approximately 300 μm, with wider widths being preferred to allow for better thermal transfer.

Figure 12:
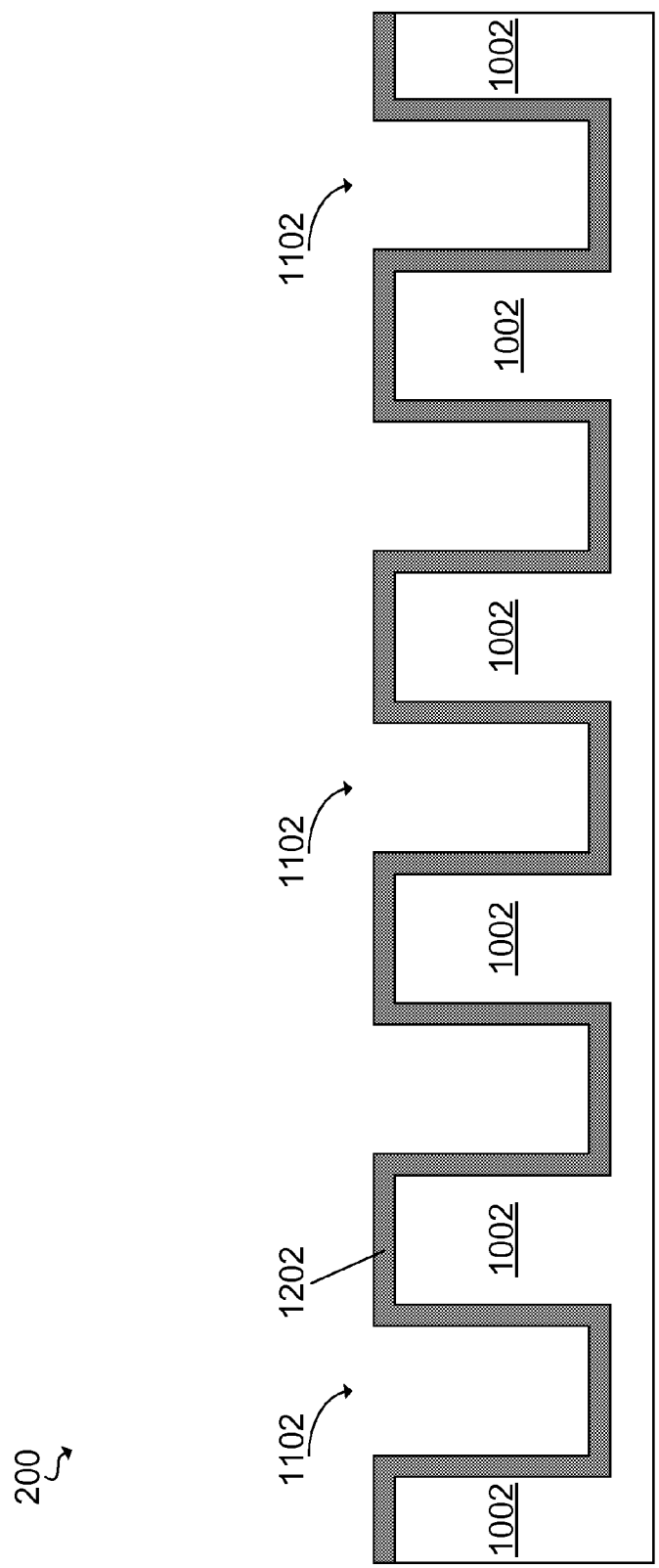
FIG. 12 is a cross section view illustrating depositing a seed layer on the interposer and in the vias, according an embodiment of the present invention.

Referring now to FIG. 12, a cross section view illustrating depositing a seed layer 1202 on the interposer 1002 and in the vias 1102 is shown. The seed layer 1202 may be composed of an electrically conductive material such as, for example, titanium, copper, cobalt, ruthenium, chromium, gold, platinum, or alloys thereof. The seed layer 1202 may be deposited conformally on the interposer 1002 using a conventional deposition process, such as, for example, atomic layer deposition (ALD), chemical vapor deposition (CVD), plasma enhanced vapor deposition (PECVD), physical vapor deposition (PVD), molecular beam deposition (MBD), pulsed laser deposition (PLD), liquid source misted chemical deposition (LSMCD), plating, or sputtering.

Figure 13:
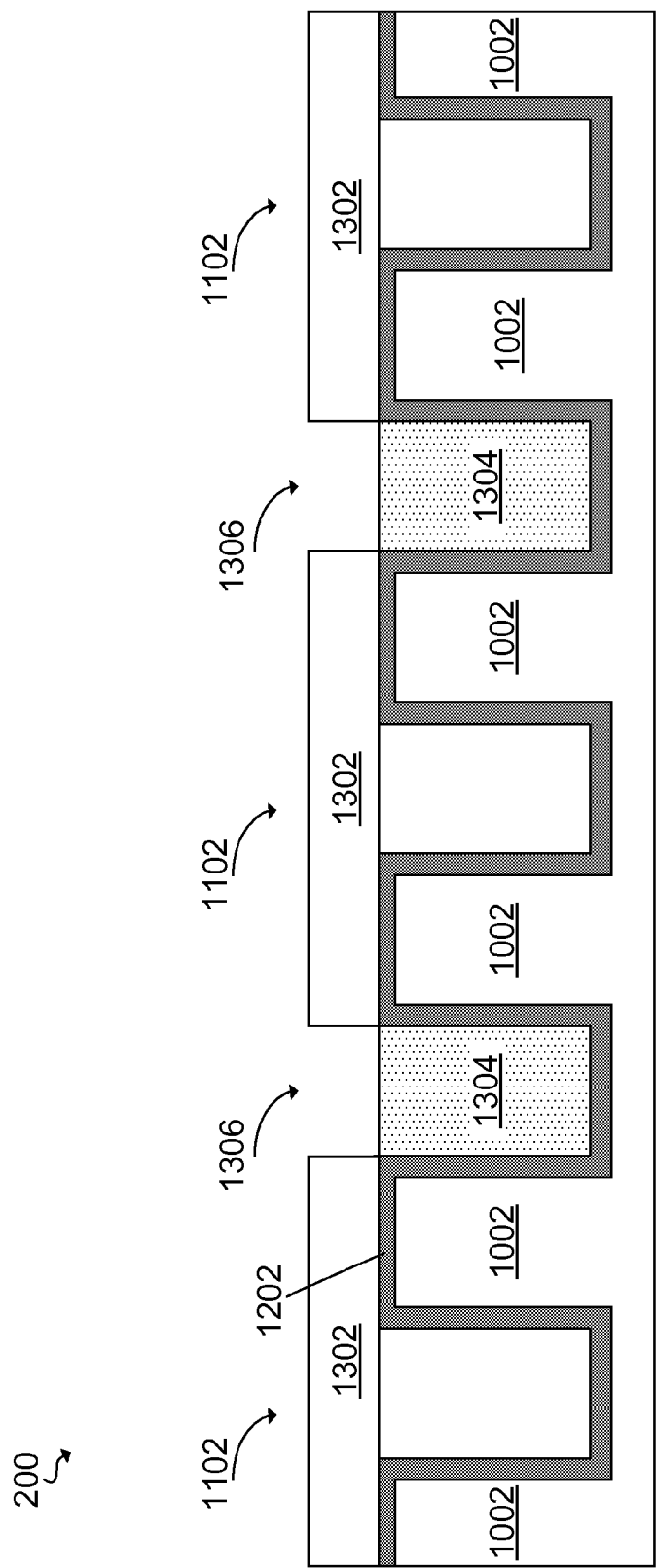
FIG. 13 is a cross section view illustrating forming an etch stop layer on portions of the interposer and over a number of the vias and depositing a n-type material in the exposed vias, according an embodiment of the present invention.

Referring now to FIG. 13, a cross section view illustrating forming a first etch stop layer 1302 on portions of the interposer 1002 and over a number of the vias 1102 is shown. The first etch stop layer 1302 may be composed of an oxide or a nitride and may be formed using a conventional deposition process, such as, for example, ALD, CVD, PECVD, PVD, MBD, PLD, LSMCD, or sputtering.

In an embodiment, one or more openings 1306 (hereinafter "openings") may be formed in the first etch stop layer 1302 using a conventional patterning and etching process. The openings 1306 may expose one or more of the vias 1102. The exposed vias 1102 may be filled with a n-type material 1304. In an embodiment, the n-type material 1304 may be composed of a semiconductor material, such as bismuth telluride, that has been doped with n-type dopants, such as arsenic or phosphorous, using a conventional doping process. After the n-type material 1304 is deposited, the first etch stop layer 1302 may be removed. In an embodiment, the first etch stop layer 1302 may be removed selective to the interposer 1002, the seed layer 1202 and the n-type material 1304 using a conventional etching process. In another embodiment, the first etch stop layer 1302 may be removed using a conventional planarization technique, such as, for example, chemical mechanical planarization (CMP).

Figure 14:
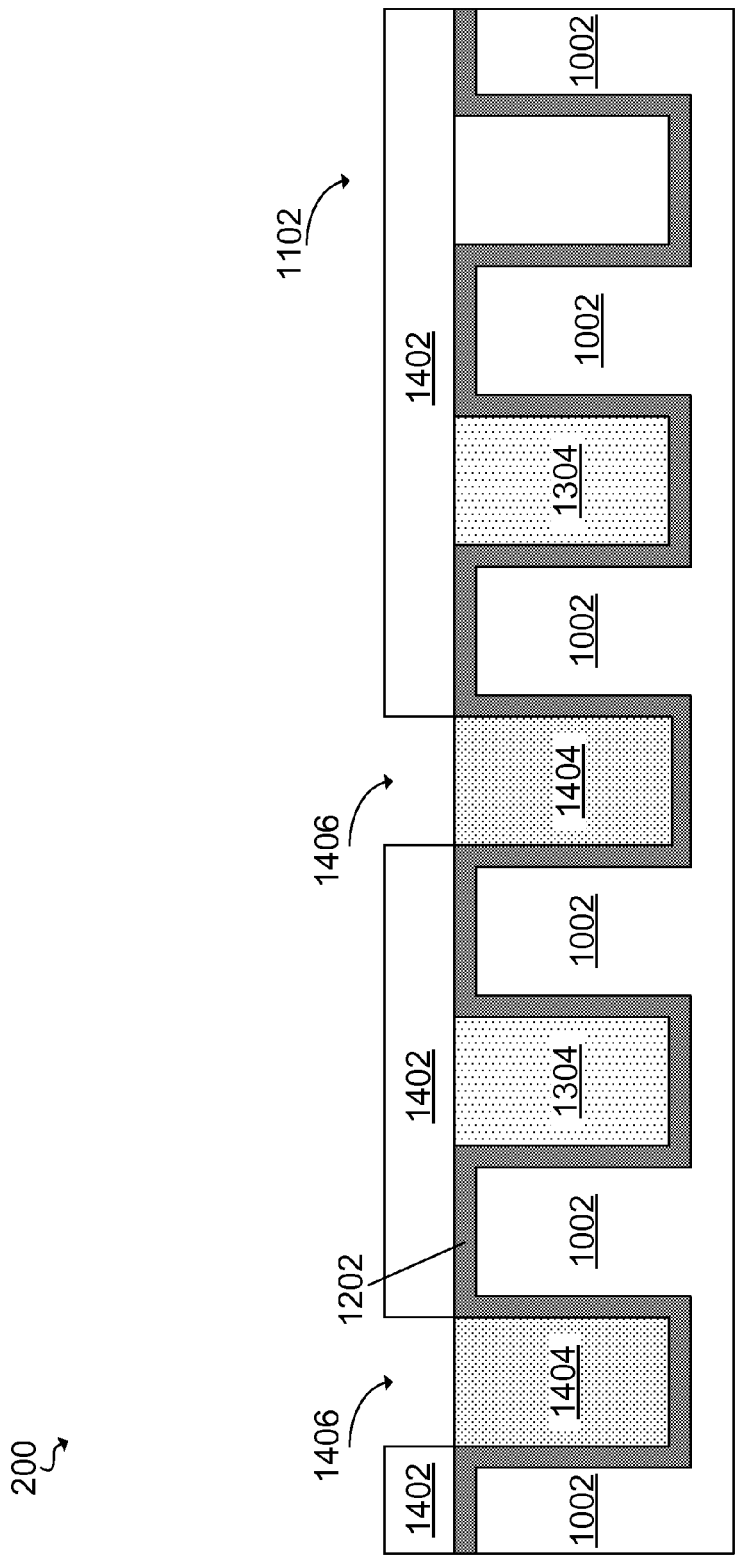
FIG. 14 is a cross section view forming an etch stop layer on portions of the interposer and over the n-type material and depositing a p-type material in the exposed vias, according an embodiment of the present invention.

Referring now to FIG. 14, a cross section view illustrating forming a second etch stop layer 1402 on portions of the interposer 1002, the n-type material 1304, and over a number of the vias 1102 is shown. The second etch stop layer 1402 may be composed of an oxide or a nitride and may be formed using a conventional deposition process, such as, for example, ALD, CVD, PECVD, PVD, MBD, PLD, LSMCD, or sputtering.

In an embodiment, one or more openings 1406 (hereinafter "openings") may be formed in the second etch stop layer 1402 using a conventional patterning and etching process. The openings 1406 may expose one or more of the vias 1102. The exposed vias 1102 may be filled with a p-type material 1404. In an embodiment, the p-type material 1404 may be composed of a semiconductor material, such as bismuth telluride, that has been doped with p-type dopants, such as boron or aluminum, using a conventional doping process.

After the p-type material 1404 is deposited, the second etch stop layer 1402 may be removed. In an embodiment, the second etch stop layer 1402 may be removed selective to the interposer 1102, the seed layer 1202, the n-type material 1304, and the p-type material 1404, using a conventional etching process. In another embodiment, the second etch stop layer 1402 may be removed using a conventional planarization technique, such as, for example, chemical mechanical planarization (CMP).

Figure 15:
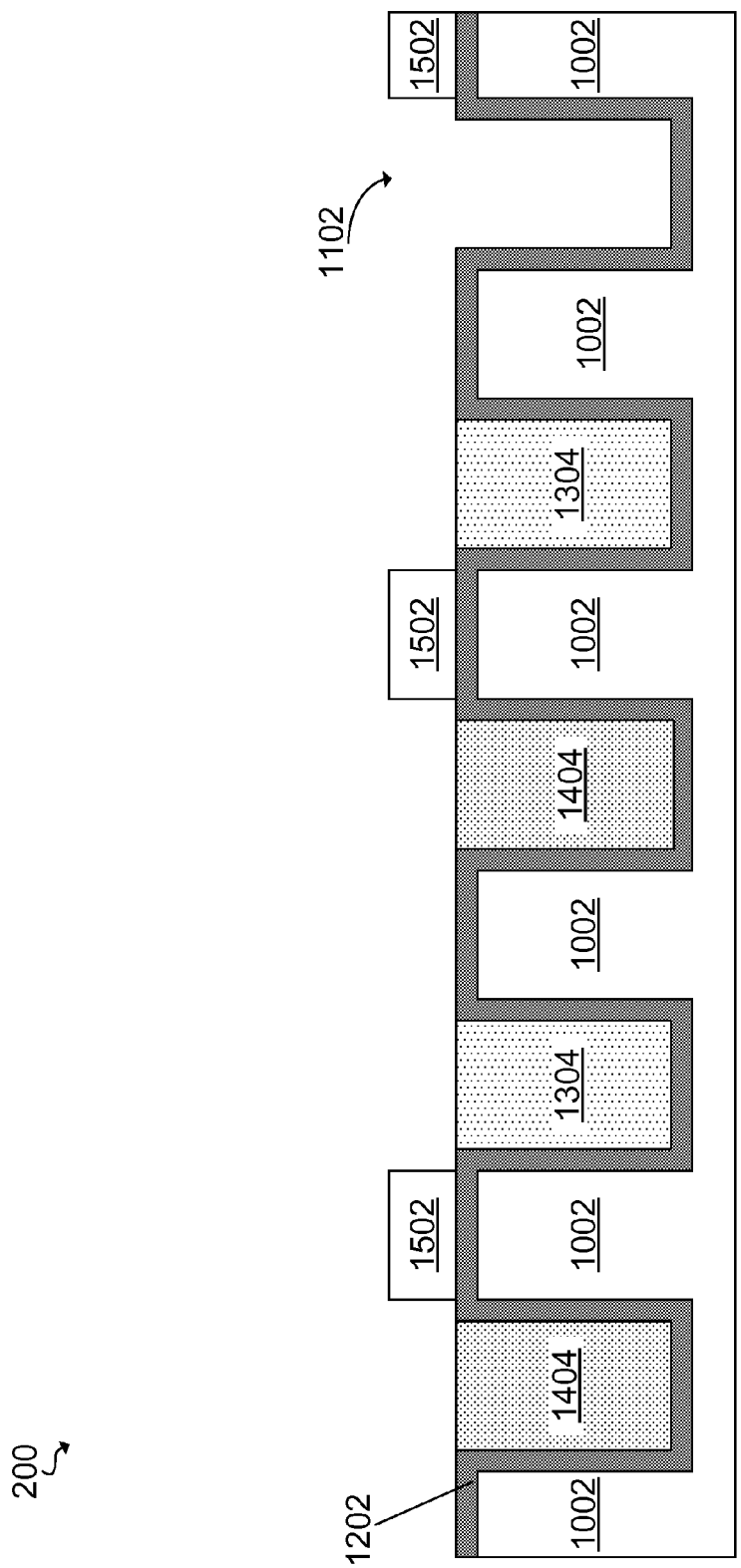
FIG. 15 is a cross section view illustrating forming a patterning layer on the seed layer, according an embodiment of the present invention.

Referring now to FIG. 15, a cross section view illustrating forming a patterning layer 1502 on the seed layer 1202 is shown. In an embodiment, the patterning layer 1502 may be composed of a conventional resist material that has been patterned by, for example, a conventional photolithography process. The resist may be a conventional positive tone or negative tone resist. In another embodiment, the patterning layer 1502 may be composed of a hardmask material, an oxide, or a nitride.

Figure 16:
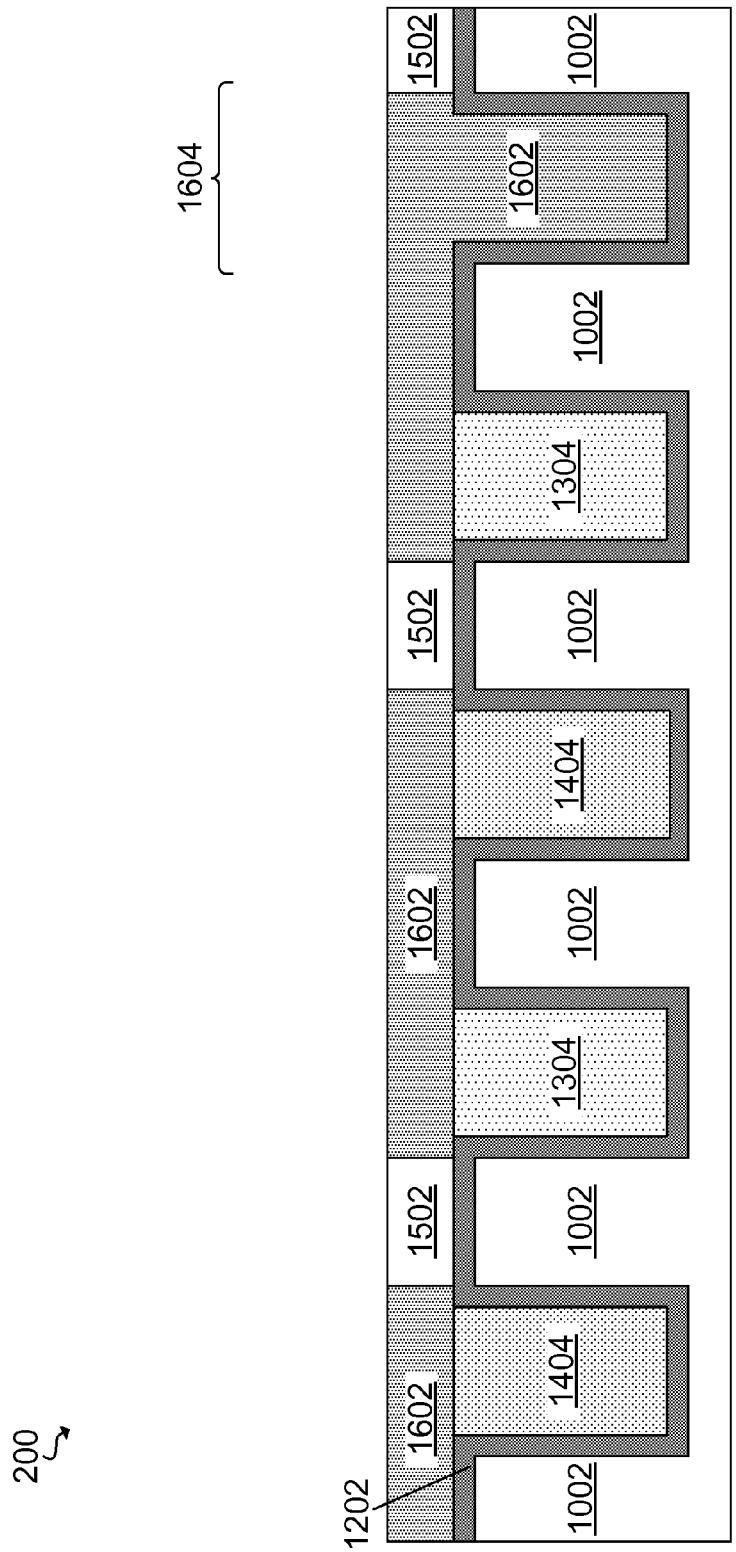
FIG. 16 is a cross section view illustrating depositing a first electrically conductive material on the seed layer and in the vias to form one or more electrically conductive vias, according an embodiment of the present invention.

Referring now to FIG. 16, a cross section view illustrating depositing a first electrically conductive material 1602 on the seed layer 1202 and in the vias 1102 (FIG. 15) to form one or more electrically conductive vias 1604 is shown. In an embodiment, the electrically conductive material 1602 may be composed of a metal, such as, for example, copper, aluminum, titanium, platinum, or alloys thereof. The electrically conductive material 1602 may be deposited using a conventional deposition process, such as, for example, ALD, CVD, PECVD, PVD, MBD, PLD, LSMCD, plating, or sputtering. The first electrically conductive material 1602 may be in direct contact with an upper surface of the n-type material 1304 and an upper surface of the p-type material 1404. After the electrically conductive material 1602 is deposited, it may be planarized using a conventional planarization techniques, such as CMP, such that an upper surface of the electrically conductive material 1602 is substantially flush with an upper surface of the patterning layer 1502.

Figure 17:
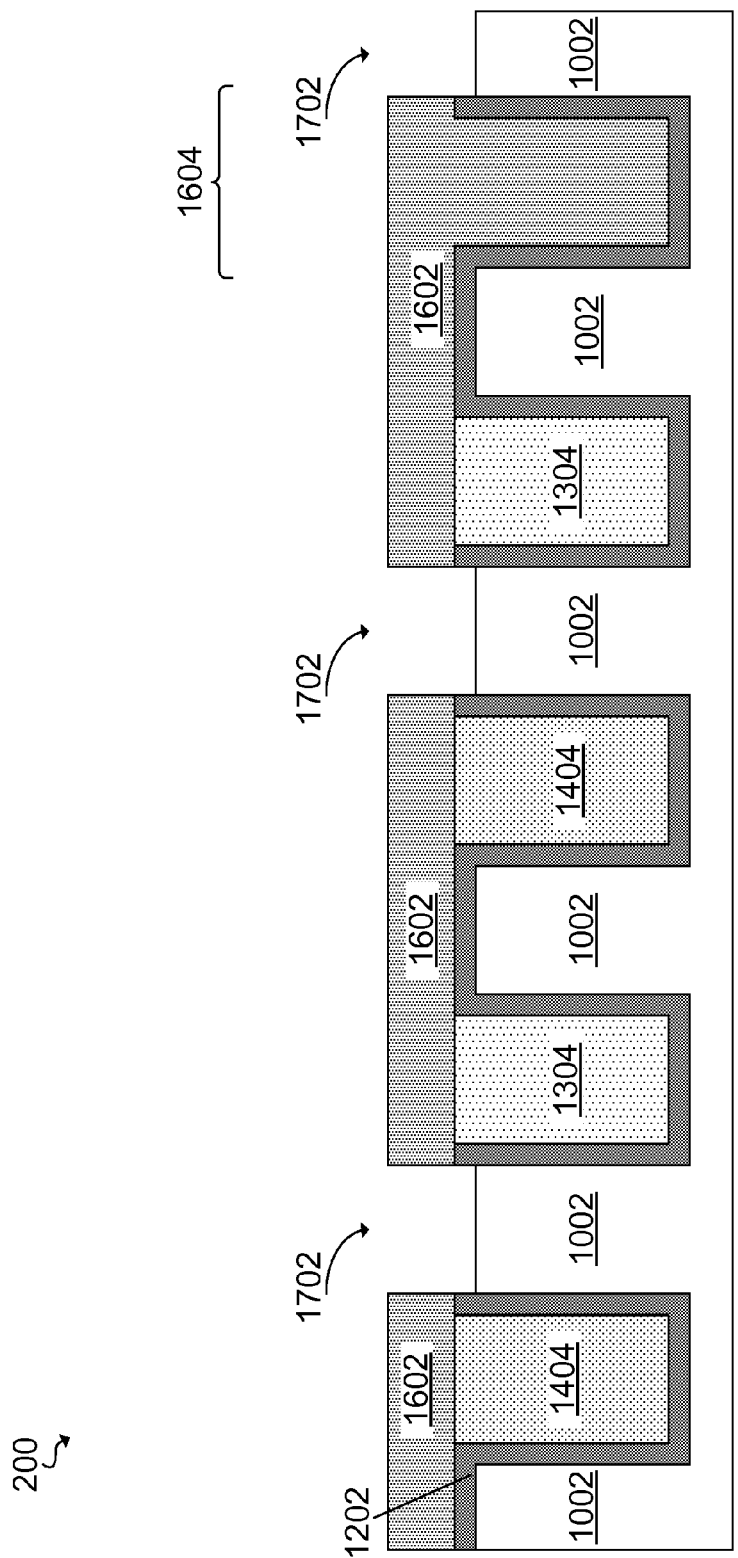
FIG. 17 is a cross section view illustrating removing the patterning layer and underlying portions of the seed layer to form one or more upper openings, according an embodiment of the present invention.

Referring now to FIG. 17, a cross section view illustrating removing the patterning layer 1502 (FIG. 16) and underlying portions of the seed layer 1202 to form one or more upper openings 1702 (hereinafter "upper openings") is shown. In an embodiment, the patterning layer 1502 and underlying portions of the seed layer 1202 may be removed, selective to the electrically conductive material 1602, using a conventional etching process, such as RIE, wet etching, or stripping. The openings 1702 may expose the upper surface of interposer 1002 and may separate portions of the electrically conductive material 1602 from one another.

Figure 18:
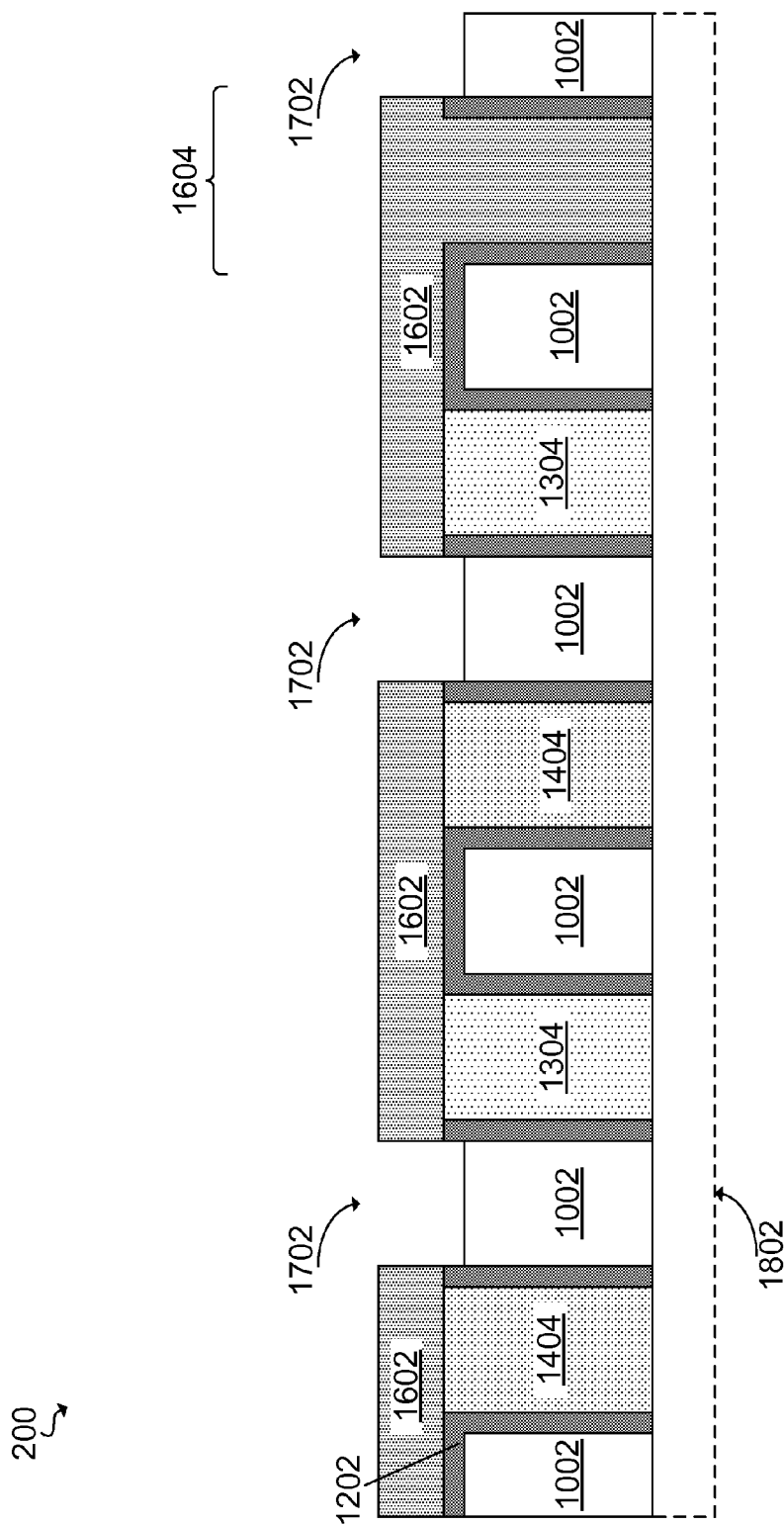
FIG. 18 is a cross section view illustrating removing a backside portion of the interposer, according an embodiment of the present invention.

Referring now to FIG. 18, a cross section view illustrating removing a portion 1802 of the interposer 1002 is shown. In an embodiment, the portion 1802 of the interposer 1002 may be removed so as to expose the electrically conductive vias 1604, the n-type material 1304, and the p-type material 1404. In an embodiment, the portion 1802 of the interposer 1002 may be removed using a conventional etching technique. In another embodiment, the portion 1802 of the interposer 1002 may be removed using a conventional planarization technique, such as, for example, CMP. In an embodiment, a portion of the seed layer 1202 may be removed from a bottom of the electrically conductive vias 1604, the n-type material 1304, and the p-type material 1404.

Figure 19:
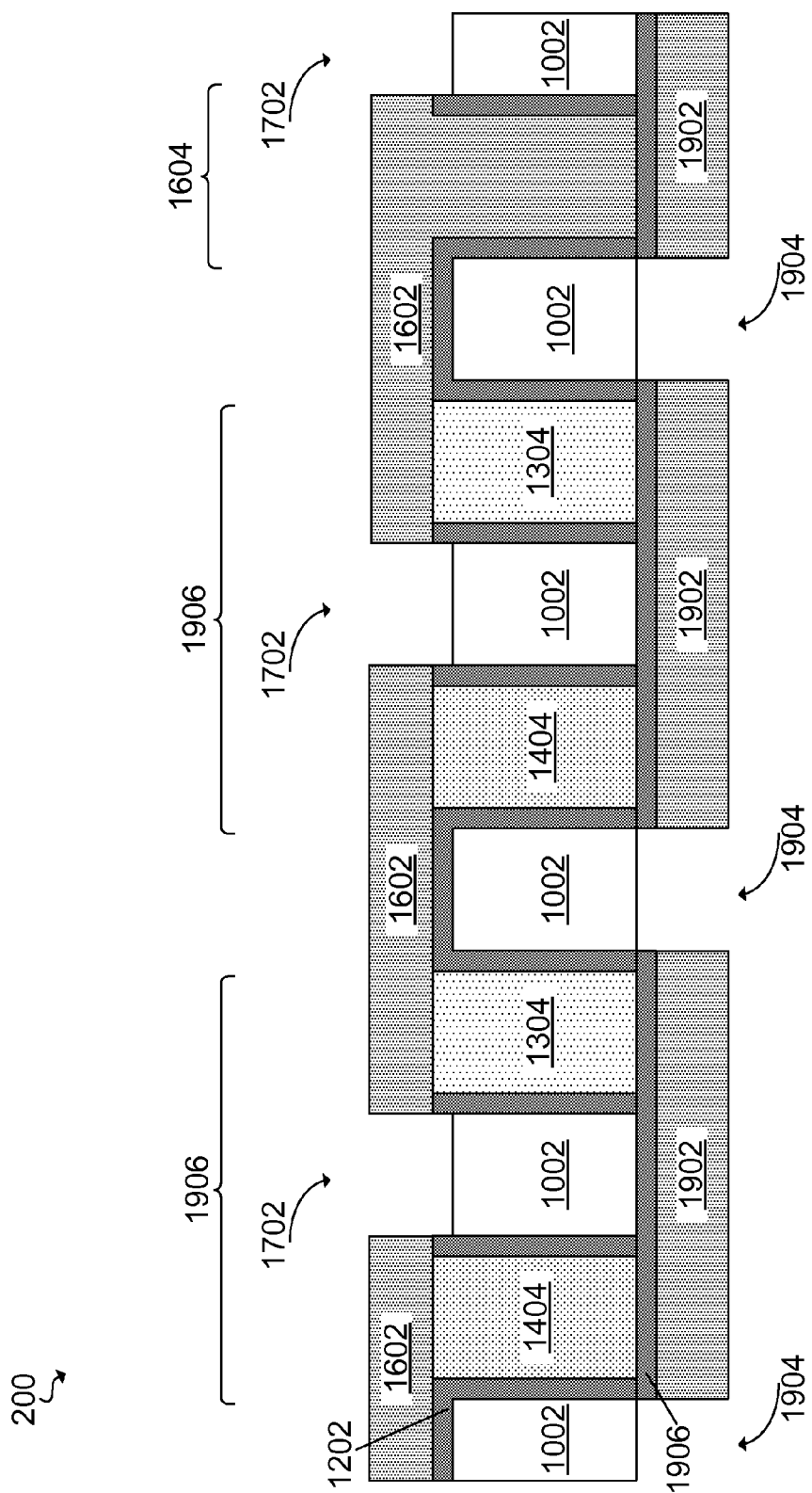
FIG. 19 is a cross section view illustrating depositing a second electrically conductive material on the seed layer and the interposer, according an embodiment of the present invention.

Referring now to FIG. 19, a cross section view illustrating depositing a second seed layer 1906 and a second electrically conductive material 1902 on the backside of the interposer 1002 is shown. The second seed layer 1906 may be substantially similar to the seed layer 1202 and may formed using substantially similar techniques as those described above with reference to FIG. 12. The second electrically conductive material 1902 may be substantially similar to the first conductive material 1602 and may be formed using substantially similar techniques as those described above with reference to FIG. 16.

An additional patterning layer (not shown) may be formed on second electrically conductive material 1902 and used to form one or more lower openings 1904 (hereinafter "lower openings") through the second electrically conductive material 1902 and the second seed layer 1906. The second electrically conductive material 1902 may be in direct contact with the second seed layer 1902 and in electrical contact with the electrically conductive via 1604, along with the n-type material 1304 and the p-type material 1404. Together with the first electrically conductive material 1602, the second electrically conductive material 1902 may form one or more peltier devices 1906 (hereinafter "peltier devices") with the n-type material 1304 and the p-type material 1404.

Figure 20:
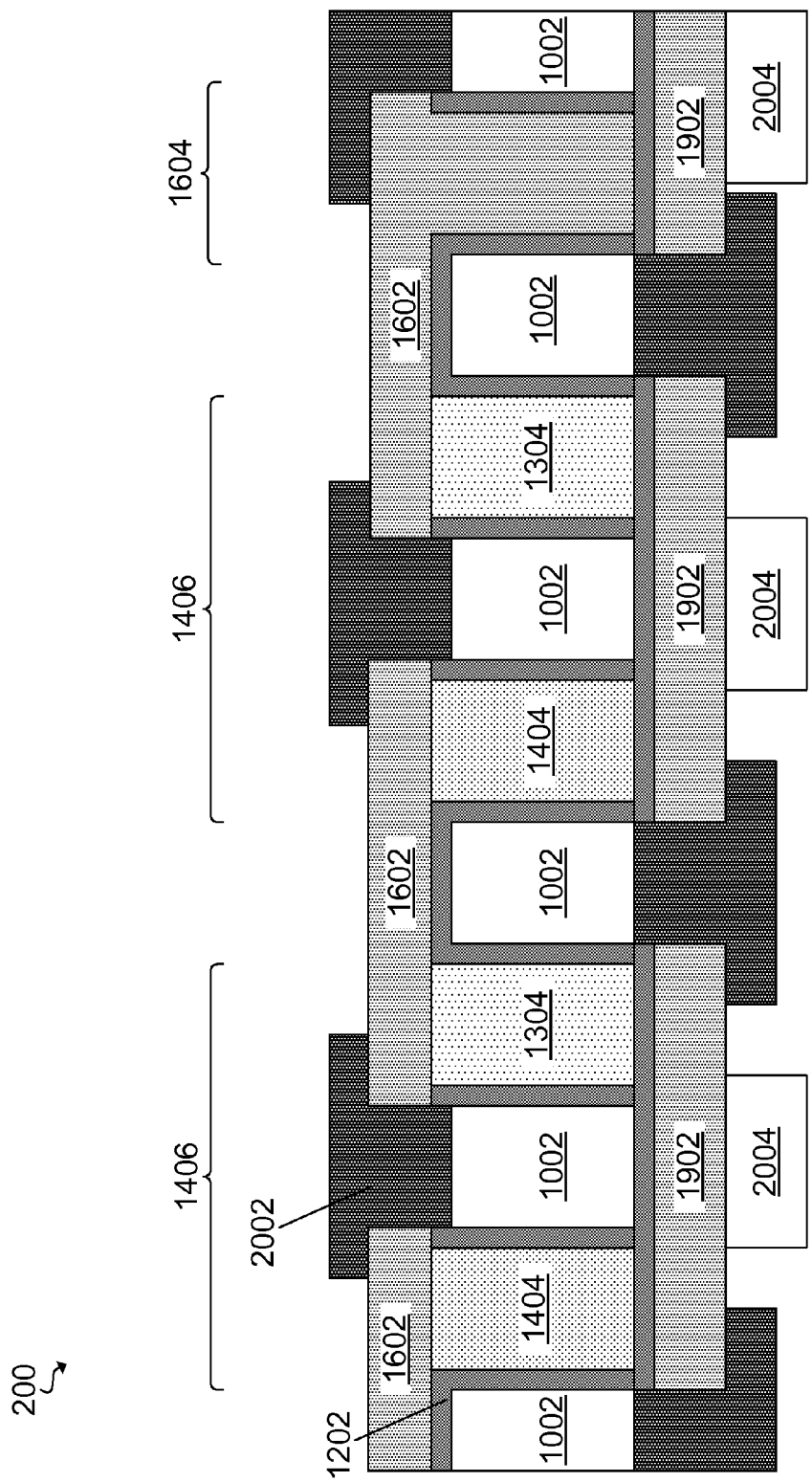
FIG. 20 is a cross section view illustrating forming an insulator on the electrically conductive material and in the upper openings and one or more lower openings, according an embodiment of the present invention.

Referring now to FIG. 20, a cross section view illustrating forming an insulator 2002 in the upper openings 1702 (FIG. 19) and the lower openings 1904 (FIG. 19) is shown. In an embodiment, the insulator 2002 may be composed of an electrically insulating material, such as, for example, a polyimide or a low-k dielectric. The insulator 2002 may be deposited using a conventional deposition technique, such as, for example, ALD, CVD, PECVD, PVD, MBD, PLD, LSMCD, plating, or sputtering. The insulator 2002 may be patterned so as to leave portions of the first electrically conductive material 1602 and the second electrically conductive material 1902 exposed. In an embodiment, one or more solder connections 2004 (hereinafter "solder connections") may be formed on the bottom side of the interposer 1002 exposed portions of the first electrically conductive material 1602 and the second electrically conductive material 1902. The solder connections 2004 may be formed using conventional techniques, and may be composed of one or more layers of conductive material.

Figure 21:
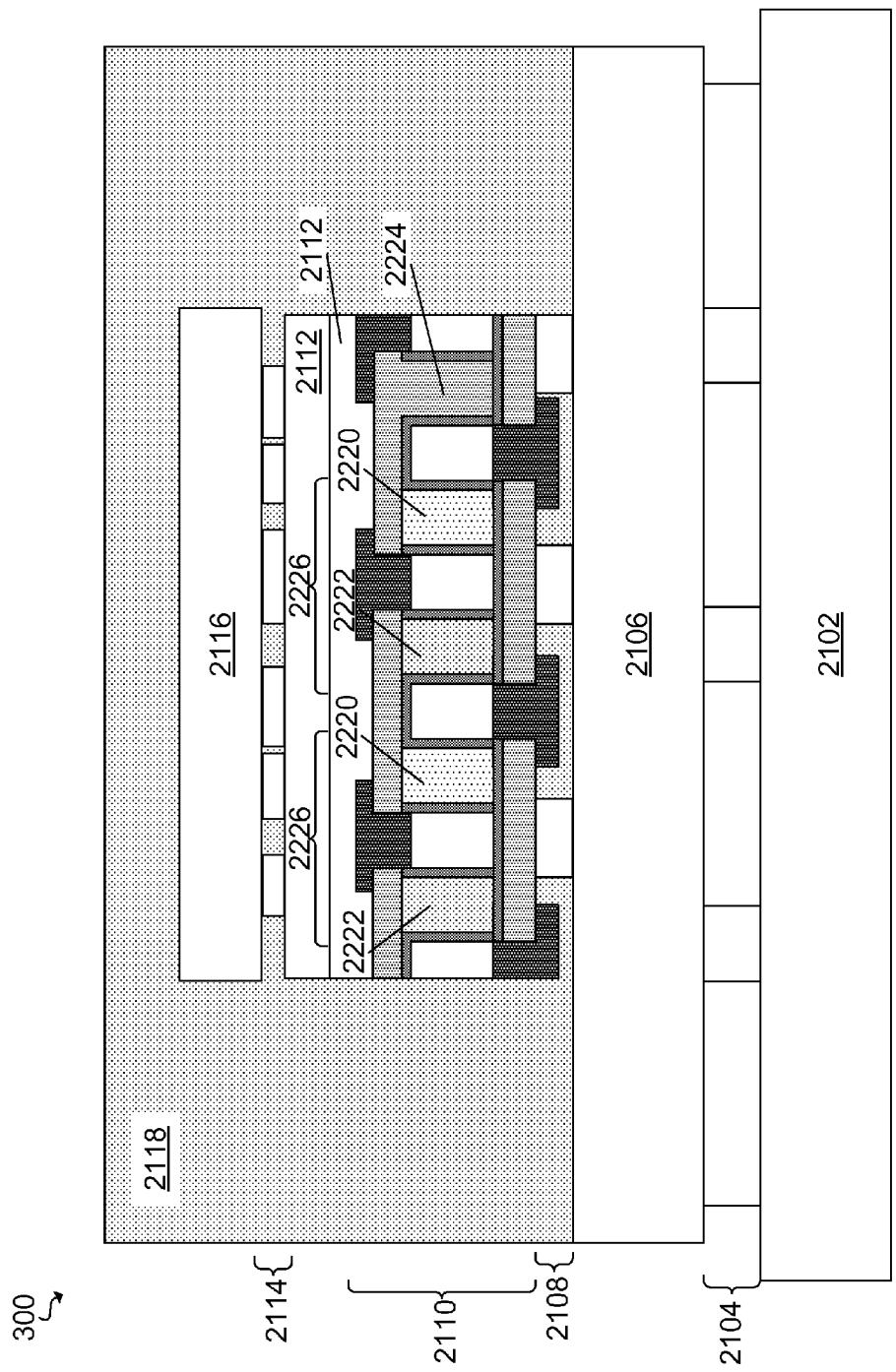
FIG. 21 is a cross section view illustrating a structure, which may be a novel 2.5 dimensional package, according to various embodiments of the present invention.

Referring now to FIG. 21, a cross section view of a structure 300 is shown. In an embodiment, the structure 300 may be a 2.5 dimensional package that includes a glass interposer 2110 with embedded peltier devices 2226. The glass interposer 2110 may correspond to the structures illustrated in FIG. 9 and FIG. 20 above. The glass interposer 2110, therefore, may have a combination of n-type material 2220, which corresponds to the n-type material 404 (FIG. 9) and the n-type material 1304 (FIG. 20), and p-type material 2222, which corresponds to the p-type material 504 (FIG. 9) and the p-type material 1404 (FIG. 20). The structure 300 may also include a substrate 2102, which may be a PCB, joined to an organic carrier 2106 with first solder connections 2104. Both the substrate 2102 and the organic carrier 2106 may have wiring layers (not shown). The organic carrier 2106 may be joined to the glass interposer 2110 by second solder connections 2108. The glass interposer 2110 may have one or more distribution layers 2112 formed thereon, that connects to one or more IC chips 2116 via micro-solder connections 2114. The organic carrier 2106, the glass interposer 2110, the distribution layers 2112, and the one or more IC chips 2116 may be completely covered in a mold compound 2118.

In an embodiment, heat generated by the one or more IC chips 2116 during operation may be transferred through the glass interposer 2110 and into the organic carrier 2106 through the embedded peltier devices 2226, where it may eventually be dissipated into the substrate 2102. Conventional 2.5 dimensional packages that utilize a glass interposer do not have this efficient pathway for heat distribution, which may cause operating problems and even failure.

Figure 22A:
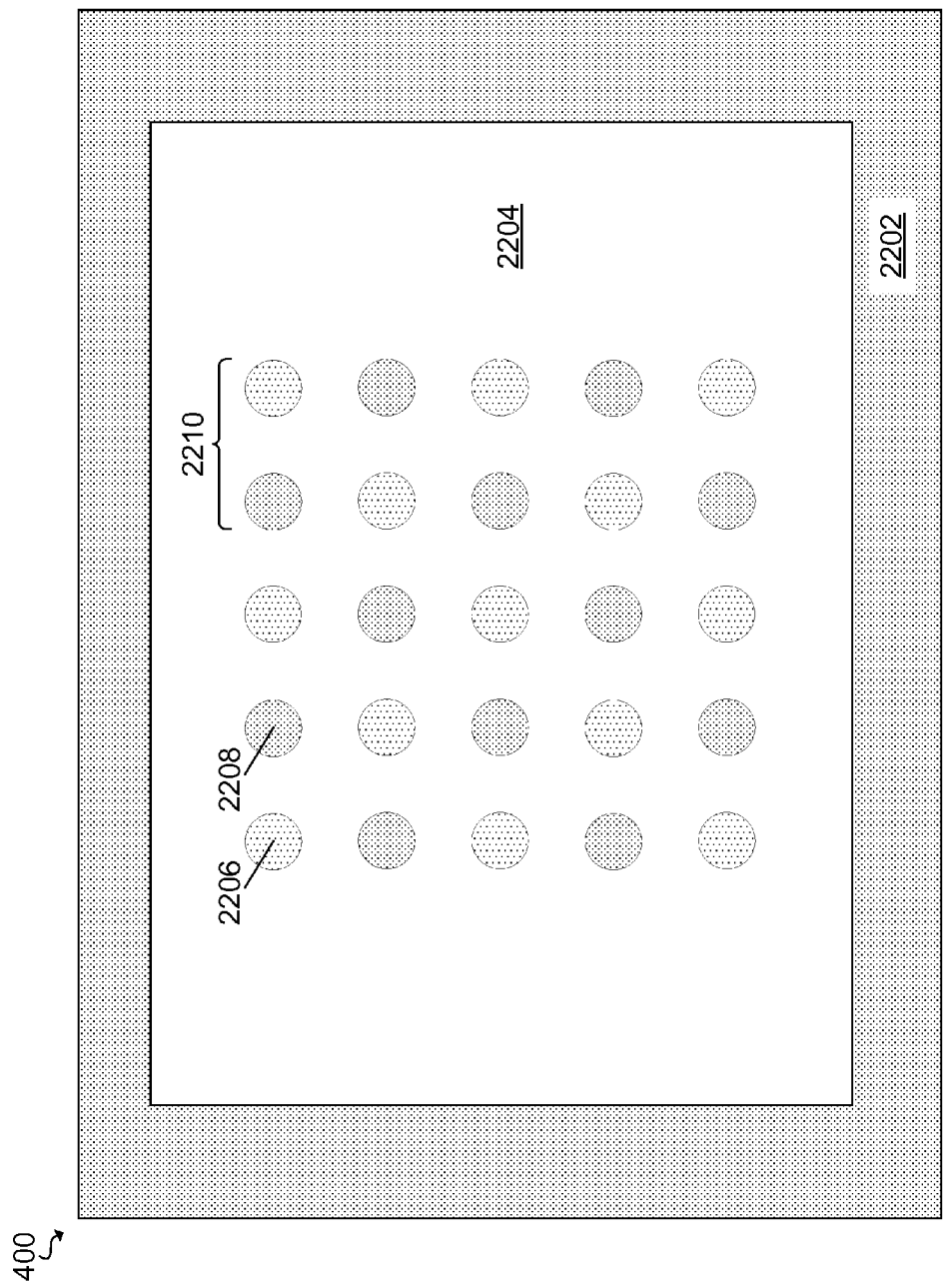
FIGS. 22A-22B are top views illustrating various patterns of peltier devices that may be formed in the interposer, according to various embodiments of the present invention.
Figure 22B:
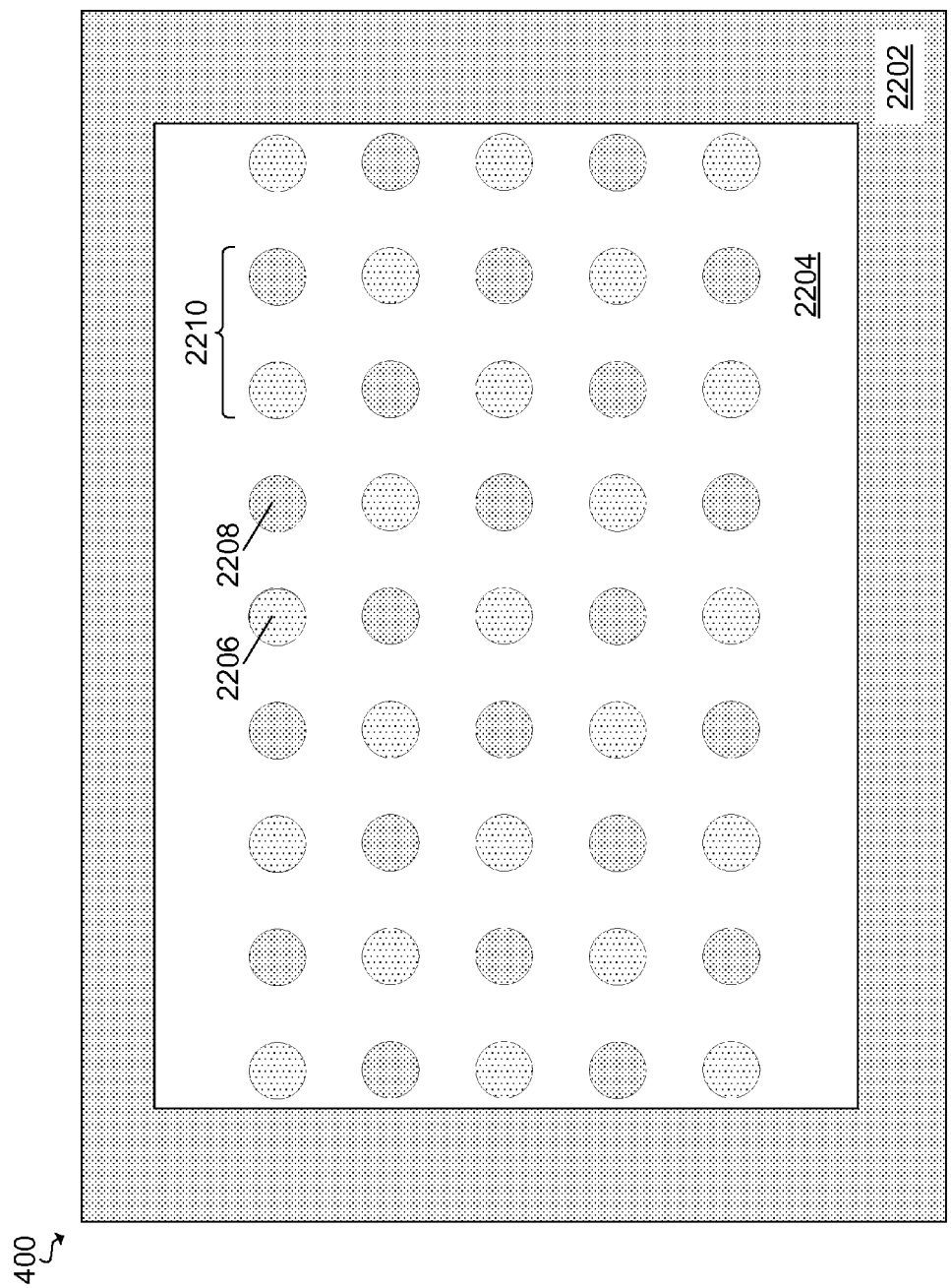

Referring now to FIGS. 22A-22B, top views of various arrangements of embedded peltier devices 2210 (described above as the peltier devices 702 with reference to FIG. 7 and as the peltier devices 1906 with reference to FIG. 19) formed on a glass interposer 2204, according to various embodiments, are shown. The glass interposer 2204 may be electrically connected to a substrate 2202, and may be part of a multi-dimensional package 400. The peltier devices 2210 may be composed of a n-type via 2206 and a p-type via 2208. As shown in FIG. 22A, the peltier devise 2210 may be located centrally on the interposer 2204. As shown in FIG. 22B, the peltier devices may be spread throughout the entire interposer 2204.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a Peltier device, comprising:
forming vias including a first via, a second via and a third via in a glass interposer by etching the glass interposer to form openings that extend only through an upper portion of the glass interposer, such that the vias have a bottom that is separated from a bottom surface of the glass interposer by a lower portion of the glass interposer;
forming a top seed layer on the glass interposer and in the vias;
depositing an n-type semiconductor material in the first via;
depositing a p-type semiconductor material in the second via; and depositing an electrically conductive material in the third via and over the first and second vias, wherein the electrically conductive material is in direct contact with an upper surface of the n-type semiconductor material in the first via and in direct contact with an upper surface of the p-type semiconductor material in the second via.

2. The method of claim 1, further comprising:
removing the lower portion of the glass interposer to expose the bottom of the vias;
forming a bottom seed layer on an exposed portion of the glass interposer, on an exposed portion of the n-type semiconductor material, on a exposed portion of the p-type semiconductor material, and on an exposed portion of the electrically conductive material;
forming a bottom conductive material on the bottom seed layer;
forming an opening in the bottom conductive material and the bottom seed layer;
forming an insulator in the opening and on the bottom conductive material; and
forming a solder connection on the bottom conductive material.

3. The method of claim 1, wherein the electrically conductive material comprises copper, aluminum, titanium, platinum, or alloys thereof.

4. The method of claim 2, wherein the n-type semiconductor material is electrically connected to another p-type semiconductor material by the bottom conductive material.

5. The method of claim 1, wherein the n-type semiconductor material comprises:
bismuth telluride doped with n-type dopants, the n-type dopants comprising arsenic or phosphorous.

6. The method of claim 1, wherein the p-type semiconductor material comprises:
bismuth telluride doped with p-type dopants, the p-type dopants comprising boron or aluminum.

7. The method of claim 1, further comprising:
removing portions of the electrically conductive material to expose the glass interposer; and
forming an insulator on the exposed glass interposer.

8. The method of claim 1, wherein the first via and the second via are adjacent.

* * * * *